United States Patent
Ichihara et al.

(10) Patent No.: US 9,203,047 B2
(45) Date of Patent: Dec. 1, 2015

(54) ORGANIC ELECTROLUMINESCENT ELEMENT

(71) Applicant: PANASONIC CORPORATION, Osaka (JP)

(72) Inventors: Tsutomu Ichihara, Osaka (JP); Yoshiharu Sanagawa, Osaka (JP); Nobuhiro Ide, Osaka (JP); Hirofumi Kubota, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/381,669

(22) PCT Filed: Mar. 12, 2013

(86) PCT No.: PCT/JP2013/001599
§ 371 (c)(1),
(2) Date: Aug. 28, 2014

(87) PCT Pub. No.: WO2013/136771
PCT Pub. Date: Sep. 19, 2013

(65) Prior Publication Data
US 2015/0028317 A1 Jan. 29, 2015

(30) Foreign Application Priority Data

Mar. 12, 2012 (JP) .................. 2012-054427
Sep. 13, 2012 (JP) .................. 2012-201194

(51) Int. Cl.
*H01L 29/08* (2006.01)
*H01L 51/52* (2006.01)

(52) U.S. Cl.
CPC ........ *H01L 51/5246* (2013.01); *H01L 51/5268* (2013.01); *H01L 51/5275* (2013.01); *H01L 51/5203* (2013.01); *H01L 51/524* (2013.01); *H01L 2251/558* (2013.01)

(58) Field of Classification Search
CPC ............ H01L 51/5246; H01L 51/5275; H01L 51/5268; H01L 51/5203; H01L 51/524; H01L 2251/558
See application file for complete search history.

(56) References Cited

U.S. PATENT DOCUMENTS

| | | | |
|---|---|---|---|
| 2002/0022148 | A1 | 2/2002 | Yudasaka |
| 2005/0046346 | A1 | 3/2005 | Tsuchiya et al. |

(Continued)

FOREIGN PATENT DOCUMENTS

| | | |
|---|---|---|
| JP | 11-026156 | 1/1999 |
| JP | 2001-332388 | 11/2001 |

(Continued)

OTHER PUBLICATIONS

U.S. Appl. No. 14/380,472 to Nobuhiro Ide et al., which was filed on Aug. 22, 2014.

(Continued)

*Primary Examiner* — Shaun Campbell
(74) *Attorney, Agent, or Firm* — Greenblum & Bernstein, P.L.C.

(57) ABSTRACT

The organic electroluminescent element has a transparent substrate, a transparent first electrode, an organic layer, a second electrode, and a light-outcoupling layer. The light-outcoupling layer is formed between the transparent substrate and the first electrode. The first electrode, the organic layer and the second electrode constitute an electroluminescent laminate. A covering substrate facing the transparent substrate is adhered to the surface of the transparent substrate via an adhesive sealing portion surrounding the periphery of the electroluminescent laminate. A connection electrode extending outward from inside a surrounded region where the electroluminescent laminate is covered with the covering substrate is formed at least on the surface of the light-outcoupling layer. The average thickness of the light-outcoupling layer in an adhesion region where the adhesive sealing portion is formed is smaller than the thickness in the central region where the electroluminescent laminate is formed.

9 Claims, 11 Drawing Sheets

(56) References Cited

U.S. PATENT DOCUMENTS

2005/0110388 A1 5/2005 Takeuchi
2010/0090587 A1* 4/2010 Tsujimura .................... 313/504

FOREIGN PATENT DOCUMENTS

| | | |
|---|---|---|
| JP | 2003-203771 | 7/2003 |
| JP | 2005-108678 | 4/2005 |
| JP | 2005-108824 | 4/2005 |
| JP | 2005-158665 | 6/2005 |
| JP | 2006-156133 | 6/2006 |
| JP | 2007-172873 | 7/2007 |
| JP | 2008-159600 | 7/2008 |
| JP | 2010-129184 | 6/2010 |

OTHER PUBLICATIONS

Search report from PCT/JP2013/001599, mail date is Jun. 4, 2013.

* cited by examiner

12
ORGANIC ELECTROLUMINESCENT ELEMENT

TECHNICAL FIELD

The present invention relates to an organic electroluminescent element.

BACKGROUND ART

Recently, organic electroluminescent elements (hereinafter, referred to also as "organic EL elements") have been used in various applications including lighting panels. An example of the organic EL element known is an EL element having a transparent substrate and a laminate of a transparent first electrode (anode), an multi-layered organic layer containing a light-emitting layer, and a second electrode (cathode) formed in that order on the surface of the transparent substrate, as described in JP-A No. 2005-108824. In organic EL elements, the light generated in the light-emitting layer when voltage is applied between the anode and the cathode passes through the transparent electrode and the substrate and is emitted outward.

Generally in organic EL elements, the intensity of the light from the light-emitting layer is decreased for example by absorption in the substrate and total reflection by an interface layer and thus, the intensity of the light withdrawn outward is smaller than the theoretical light intensity. Accordingly, there exists a need for improvement of the light-outcoupling efficiency of organic EL elements for improvement of brightness. It is known as a possible measure to form a light-outcoupling layer on the first electrode-sided surface of the transparent substrate for improvement of light-outcoupling efficiency. The light-outcoupling layer, when formed, reduces the total reflection at the interface between the substrate and the electrode and permits increase of the amount of the light emitted outward.

Since organic layers in organic EL elements are likely to be degraded by water, it is important to prevent penetration of water into the element. Degradation of an organic layer causes troubles such as insufficient light emission efficiency and thus deterioration of reliability of the organic EL element. Thus, for protection of the organic layer from water, a laminate containing an organic layer is normally covered and blocked from external environment by a covering material adhered to the transparent substrate. When a glass material is used as the transparent substrate and the sealing material, the glass material, which is resistant to water penetration, reduces penetration of water through the region. However, when a light-outcoupling layer for example of a plastic or resin material is formed on the surface of the transparent substrate for improvement of light-outcoupling efficiency, the plastic or resin material may cause a problem of penetration of water through the material because it is a material with relatively high water permeability.

SUMMARY OF THE INVENTION

An object of the present invention, which was made under the circumstances above, is to provide a highly reliable organic electroluminescent element superior in light-outcoupling efficiency, effectively resistant to water penetration and thus resistant to degradation.

The organic electroluminescent element according to the present invention has a transparent substrate (1), a transparent first electrode (3) formed on the surface (101) of the transparent substrate (1), an organic layer (4) formed on a first surface (301) of the first electrode (3), a second electrode (5) formed on the surface (401) of the organic layer (4), and a light-outcoupling layer (2) formed between the surface (101) of the transparent substrate (1) and a second surface (302) of the first electrode (3). The first electrode (3), the organic layer (4) and the second electrode (5) constitute an electroluminescent laminate (10). A covering substrate (6) facing the transparent substrate (1) is adhered to the surface (101) of the transparent substrate (1) via an adhesive sealing portion surrounding the periphery of the electroluminescent laminate (10). A connection electrode (11, 11) extending outward from inside a surrounded region where the electroluminescent laminate (10) is covered with the covering substrate (6) is formed at least on a surface (201) of the light-outcoupling layer (2). An average thickness (T1) of the light-outcoupling layer (2) in an adhesion region where the adhesive sealing portion is provided is smaller than a thickness (T0) in a central region (S) where the electroluminescent laminate (10) is provided.

In an embodiment of the present invention, the light-outcoupling layer preferably has an end (2a) located at the adhesion region.

In an embodiment of the present invention, preferably, the light-outcoupling layer (2) has an end region outside the adhesion region (RB), and the light-outcoupling layer (2) has a thickness (T2) at the end region which is smaller than the thickness (T0) at the central region where the electroluminescent laminate (10) is formed.

In an embodiment of the present invention, preferably, the light-outcoupling layer (2) includes a low-refractive index layer (21) and a high-refractive index layer (22) having a refractive index larger than that of the low-refractive index layer (21), the low-refractive index layer (21) is formed closer to the surface (101) of the transparent substrate (1) than the high-refractive index layer (22), the high-refractive index layer (22) is formed closer to the second surface (302) of the first electrode (3) than the low-refractive index layer (21), and the light-outcoupling layer (2) has an uneven structure (23) at an interface between the low-refractive index layer (21) and the high-refractive index layer (22).

In an embodiment of the present invention, preferably, one of the low-refractive index layer (21) and the high-refractive index layer (22) is less moisture-permeable and extends more outward than the other layer.

In an embodiment of the present invention, preferably, the light-outcoupling layer (2) has an inclined portion where a thickness thereof is gradually smaller towards a periphery thereof than at the central region.

In an embodiment of the present invention, the connection electrode (11) preferably includes a first connection electrode (11a) electrically connected to the first electrode (3) and a second connection electrode (11b) electrically connected to the second electrode (5). In an embodiment of the present invention, the first connection electrode (11a) is preferably an extended part of the first electrode (3).

In an embodiment of the present invention, a total of a thickness of the light-outcoupling layer (2) at a position where the connection electrode (11) is formed in the adhesion region, a thickness of the connection electrode (11), and a thickness of the adhesive sealing portion is larger than a total of a thickness of the light-outcoupling layer (2) at the central region and a thickness of the electroluminescent laminate (10).

It is possible according to the present invention by forming a light-outcoupling layer to improve light-outcoupling efficiency and also to suppress water penetration effectively, as the light-outcoupling layer has a thickness in the adhesion region smaller than that in the central region. It is thus possible to obtain a high-reliability organic electroluminescent element superior in light-outcoupling efficiency and resistant to degradation.

DESCRIPTION OF EMBODIMENTS

Figure 11A:
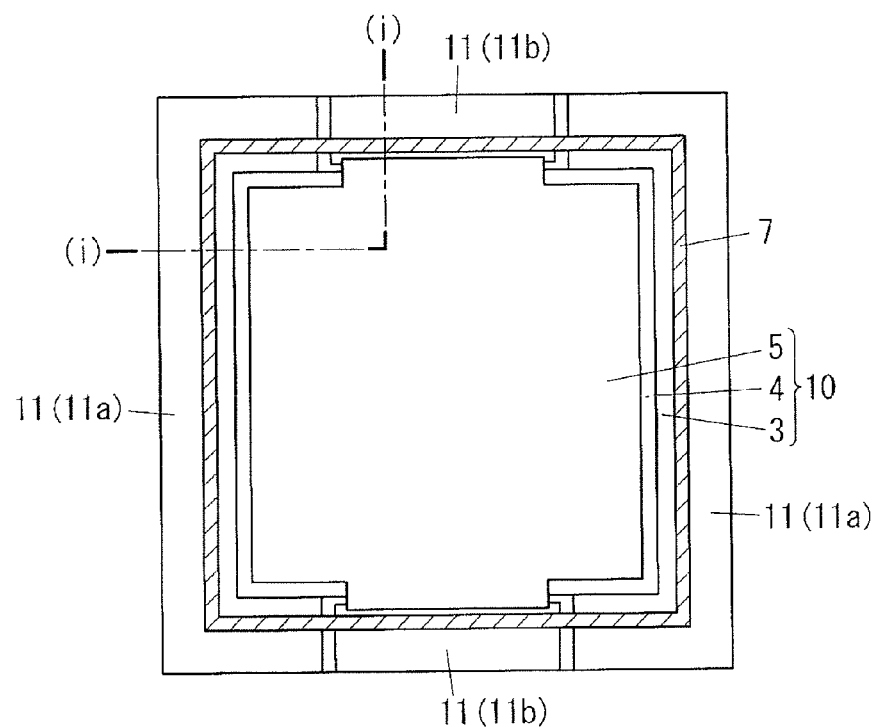
FIG. 11A is a plan view illustrating an example of the organic electroluminescent element and FIG. 11B is a cross-sectional view thereof along the line (i)-(i) in FIG. 11A.
Figure 11B:
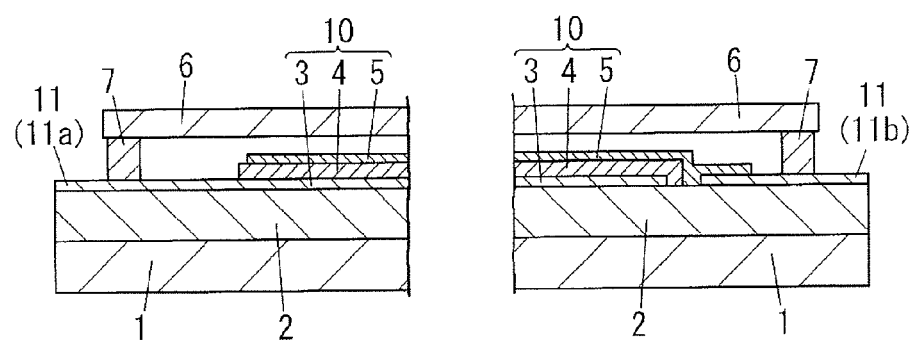

FIGS. 11A to 11B show an example of the organic EL element that contributed to creation of the organic electroluminescent element (organic EL element) according to the present invention. The organic EL element has a light-outcoupling layer 2 formed on the surface of a transparent substrate 1. An electroluminescent laminate 10 having a transparent first electrode 3, an organic layer 4 and a second electrode 5 which are arranged in that order is formed on the surface of the light-outcoupling layer 2. In addition, a covering substrate 6 facing the transparent substrate 1 is adhered to the transparent substrate 1 via an adhesive sealing portion 7 surrounding the electroluminescent laminate 10. Further, the connection electrode 11, which includes a first connection electrode 11a electrically connected to the first electrode 3 and a second connection electrode 11b electrically connected to the second electrode 5, is formed so as to extend from inside the surrounded region to outside. The connection electrode 11 as well as the first electrode 3 are formed of the transparent electroconductive layer. The first connection electrode 11a and the second connection electrode 11b are separated and electrically insulated from each other. In such a configuration, the light generated in the electroluminescent laminate 10 enters into the transparent substrate 1 via the light-outcoupling layer 2 and is then emitted outward, thus permitting higher light outcoupling efficiency.

Regarding FIG. 11A, to briefly illustrate the structure of the element, the covering substrate 6 is not shown and the region where the adhesive sealing portion 7 is to be formed is indicated by hatching. FIG. 11B is a cross-sectional view along the line (i)-(i) in FIG. 11A and the first connection electrode 11a is shown in the left side and the second connection electrode 11b in the right side of the figure.

Here, in the organic EL element in the embodiment of FIGS. 11A and 11B, the light-outcoupling layer 2 is formed on the surface of the transparent substrate 1. In such a configuration, there is a concern that water may penetrate inward further via the light-outcoupling layer 2 and reach the organic layer 4, causing degradation of the organic layer 4.

The light-outcoupling layer 2 may be formed of a moisture-proof material for prevention of water penetration through the light-outcoupling layer 2. However, the light-outcoupling layer 2 formed of a moisture-proof material should satisfy the requirements in optical transparency, light-outcoupling efficiency as well as moisture proofness. Therefore, preparation of the light-outcoupling layer 2 may be troublesome.

Accordingly, it is also an object of the organic electroluminescent element according to the present invention to overcome the above-mentioned insufficiency.

Figure 1A:
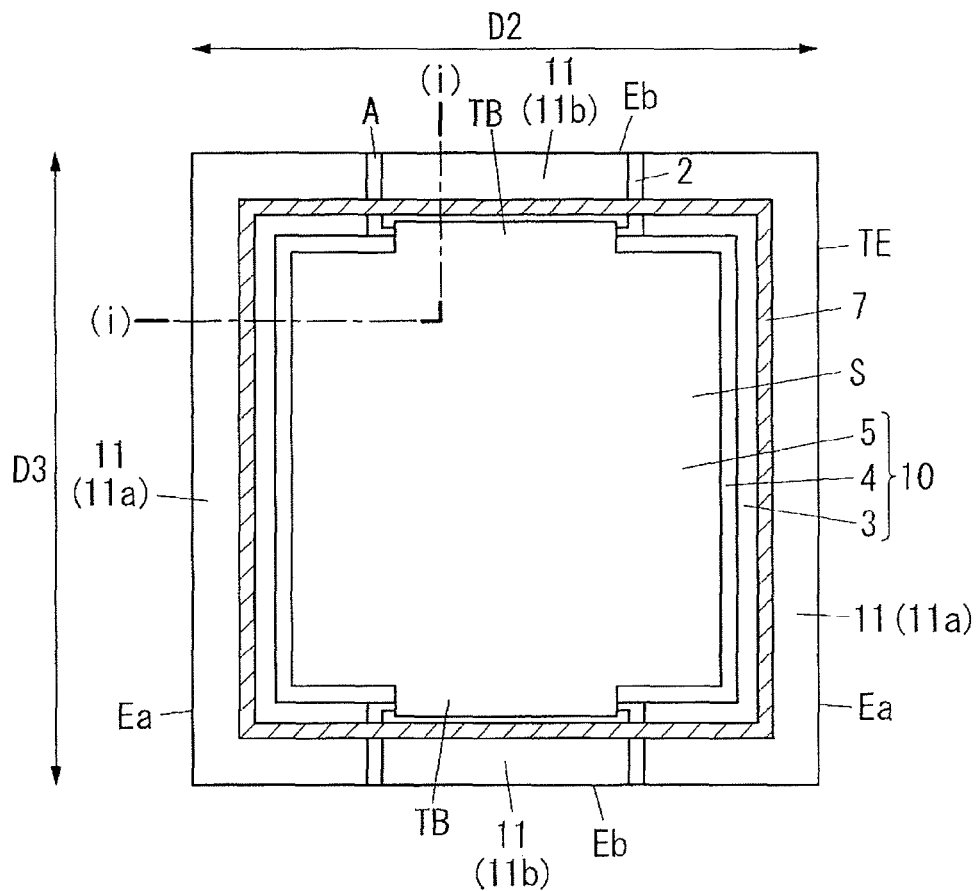
FIG. 1A is a plan view illustrating an embodiment of the organic electroluminescent element and FIG. 1B is a cross-sectional view thereof along the line (i)-(i) in FIG. 1A.
Figure 1B:
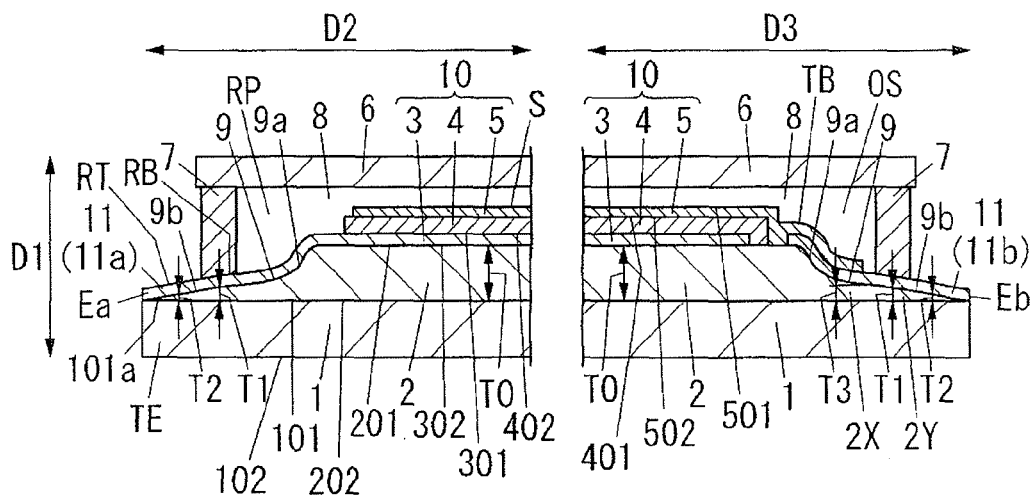

FIGS. 1A and 1B show an embodiment of the organic electroluminescent element (organic EL element). The organic EL element has a transparent substrate 1 and an electroluminescent laminate 10 having a transparent first electrode 3, an organic layer 4 and a second electrode 5 which are arranged in this order on the light-outcoupling layer 2-sided surface of the transparent substrate 1 on which the light-outcoupling layer 2 is formed. A covering substrate 6 facing the transparent substrate 1 is adhered to the transparent substrate 1 via an adhesive sealing portion 7 surrounding the periphery of the electroluminescent laminate 10 and the electroluminescent laminate 10 is covered with the covering substrate 6. In the organic EL element, the surrounded region RP is defined as the region surrounded by the adhesive sealing portion 7 in a plan view (when seen from the direction perpendicular to the surface of the transparent substrate 1).

In other words, the organic EL element in the present embodiment has the transparent substrate 1, the light-outcoupling layer 2, the transparent first electrode 3, the organic layer 4 and the second electrode 5. The transparent substrate 1 has a first surface 101 and a second surface 102 respectively to the first and second sides of the transparent substrate 1 in the first direction D1 (for example, vertical direction in FIG. 1B), i.e., in the thickness direction of the transparent substrate 1, and the light-outcoupling layer 2 is formed on the surface 101 of the transparent substrate 1. In the embodiment shown in FIGS. 1A and 1B, the light-outcoupling layer 2 is in contact with the surface 101 of the transparent substrate 1.

The light-outcoupling layer 2 has a first surface 201 and a second surface 202 respectively to the first and second sides in the first direction D1, and the first electrode 3 (connection electrode 11) is formed on the first surface 201 of the light-outcoupling layer 2. The first electrode 3 (connection electrode 11) extends to both edge along the second direction D2 that is perpendicular to the first direction D1. In the embodiment of FIGS. 1A and 1B, the first electrode 3 is formed in contact with the first surface 201 of the light-outcoupling layer 2.

The first electrode 3 has a first surface 301 and a second surface 302 respectively to the first and second sides in the first direction D1 and the organic layer 4 is formed on the first surface 301 of the first electrode 3. In the embodiment of FIGS. 1A and 1B, the organic layer 4 is formed in contact with the first surface 301 of the first electrode 3.

The organic layer 4 has a first surface 401 and a second surface 402 respectively to the first and second sides in the first direction D1, and the second electrode 5 is formed on the first surface 401 of the organic layer 4. In the embodiment of FIGS. 1A and 1B, the second electrode 5 is formed in contact with the first surface 401 of the organic layer 4.

The second electrode 5 has a first surface 501 and a second surface 502 respectively on the first and second sides in the first direction D1. In the embodiment of FIGS. 1A and 1B, there is nothing formed on the first surface 501 of the second electrode 5.

Also in the embodiment of FIGS. 1A and 1B, the light-outcoupling layer 2 is formed between the first electrode 3 and the transparent substrate 1 and the first and second surfaces 201 and 202 of the light-outcoupling layer 2 are respectively in contact with the second surface 302 of the first electrode 3 and the first surface 101 of the transparent substrate 1. In the embodiment of FIGS. 1A and 1B, the organic layer 4 is formed between the second electrode 5 and the first electrode 3, and the first and second surfaces 401 and 402 of the organic layer 4 are respectively in contact with the second surface 502 of the second electrode 5 and the first surface 301 of the first electrode 3.

Regarding FIG. 1A, to briefly illustrate the structure of the element configuration, the covering substrate 6 is not shown, and the region where the adhesive sealing portion 7 is to be formed is indicated by a shaded area. FIG. 1B is a cross-sectional view along the line of (i)-(i) in FIG. 1A and the end Ea of the first connection electrode 11a is shown in the left side and the end Eb of the second connection electrode 11b in the right side of the figure.

The organic EL element shown in FIGS. 1A and 1B has a connection electrode 11 extending outward from inside the surrounded region on the surface of the light-outcoupling layer 2. The connection electrode 11 includes a first connection electrode 11a electrically connected to the first electrode 3 and a second connection electrode 11b electrically connected to the second electrode 5. In this case, the first connection electrode 11a and the second connection electrode 11b are separated from each other by an opening region A described below. Thus, the first connection electrode 11a and the second connection electrode 11b are electrically insulated from each other. The presence of the opening region A permits application of voltage to the first electrode 3 and the second electrode 5 without short circuiting trouble.

The transparent substrate 1 for use, which is a transparent substrate with optical transparency, may be a glass substrate. It is possible by using a glass substrate as the transparent substrate 1 to prevent water penetration into the surrounded region because glass has low water permeability. In the organic EL element of the present embodiment, a light-outcoupling layer 2 is formed on the first surface 101 of the transparent substrate 1 and an electroluminescent laminate 10 is formed on the first surface 201 of the light-outcoupling layer 2. The region where the electroluminescent laminate 10 is to be formed is the central region S of the transparent substrate 1 in a plan view (as seen in the direction perpendicular to the surface of the substrate). An adhesive sealing portion 7 surrounding the entire periphery OS of the electroluminescent laminate 10 is formed in the periphery OS of the electroluminescent laminate 10 and the electroluminescent laminate 10 is placed in the surrounded region RP obtained by forming the adhesive sealing portion 7.

The light-outcoupling layer 2 is a layer that allows light to pass therethrough and permits more effective outcoupling of the light generated in the organic layer 4 outward through the first electrode 3. It is desired for improvement of the light outcoupling efficiency to make the refractive index of the light-outcoupling layer 2 larger than that of the transparent substrate 1. The light generated in the electroluminescent laminate reaches, directly or by reflection, the first surface 101 of the transparent substrate 1. When the difference in refractive index at the interface between the transparent substrate 1 and the light-outcoupling layer 2 is large, the light may not be emitted outward effectively because of total reflection. On the other hand, a light-outcoupling layer 2 having a refractive index close to that of the first electrode 3 is formed on the second surface 302 side (light output side) of the first electrode 3. Therefore, the difference in refractive index between the first electrode 3 and the light-outcoupling layer 2 can be reduced and thus the light outcoupling efficiency for light entering the light-outcoupling layer 2 can be improved. The difference in refractive index between the light-outcoupling layer 2 and the first electrode 3 is preferably smaller and it may be, for example 0.2 or less, preferably 0.1 or less, but is not limited thereto.

In the present embodiment, the light-outcoupling layer 2 may have a light-outcoupling structure for improvement of light outcoupling efficiency formed at the interface with the transparent substrate 1. The light-outcoupling structure formed may be a layer (light-scattering layer) having a function to scatter light. Alternatively, a lens array layer may be the light-outcoupling structure. The lens array layer is a layer having fine protrusions densely aligned in a plane. The protrusions on the lens array layer may be in the shape of hemisphere, pleat, pyramid (quadrangular pyramid) or the like. When the light-outcoupling layer 2 has a light-outcoupling structure, the light moving toward the transparent substrate 1 is scattered by the light-outcoupling structure, restricting total reflection, and thus emitted outward more efficiently. Specifically, as described below (see FIG. 6), it may have a configuration consisting of two layers: a low-refractive index layer 21 and a high-refractive index layer 22. In addition, there may be an uneven structure 23 formed between the low-refractive index layer 21 and the high-refractive index layer 22.

In addition, a light-outcoupling structure unit, a structure for improvement of light outcoupling efficiency, may be formed on the first surface 101, i.e., the light-outcoupling layer 2-sided surface, of the transparent substrate 1. It is possible in this way to increase the light outcoupling efficiency further. The light-outcoupling structure unit can be prepared by forming an uneven structure on the first surface 101 of the transparent substrate 1 or by forming a light-scattering layer containing a light-scattering substance. A light-outcoupling function unit such as a light-scattering layer may be also formed additionally on the second surface 102 of the transparent substrate 1. The light-outcoupling structure unit or the light-outcoupling function unit is not limited if it is a transparent structure.

The light-outcoupling layer 2 may be, for example, a plastic layer. The plastic layer can be formed as a layer of a molded article (such as sheet or film), which is obtained by molding and hardening a synthetic resin as a raw material for plastic, and is to be laminated on the transparent substrate 1. The plastic layer for use may be a layer of a plastic material such as PET (polyethylene terephthalate) or PEN (polyethylene naphthalate). Alternatively, an acrylic, epoxy or other resin may be used. The plastic layer-preparing method is not particularly limited, and may be any suitable molding method such as calendering, roll molding or injection molding. The material for the light-outcoupling layer 2 is preferably flexible. When it is flexible, it is possible to form the light-outcoupling layer 2 on the transparent substrate 1, for example, by supplying the material sequentially from a roll of the material. When the light-outcoupling layer 2 is flexible, it is also possible to prepare a flexible element.

When the light-outcoupling layer 2 is made of a plastic sheet, for example, the light-outcoupling layer 2 can be prepared by adhering the material for the light-outcoupling layer 2 onto the first surface 101 of the transparent substrate 1. The adhesion may be performed for example by thermal compression or by using an adhesive. Alternatively, the light-outcoupling layer 2 may be a resin layer formed by coating a resin. If such a resin layer is formed, the light-outcoupling layer 2 can be formed by coating a resin material on the first surface 101 of the transparent substrate 1. Alternatively, a light-outcoupling layer 2 having a function to scatter light can be formed, for example, by introducing a light-scattering substance, such as particles and pores, into a plastic layer or a resin layer. Alternatively, the light-outcoupling structure can be obtained by roughening the surface of a plastic layer or a resin layer or thus forming a layer of a light scattering material on the surface of the plastic layer or the resin layer. The light is scattered then by reflection by the irregular-surfaced interface or the particle surface or by reflection and refraction caused by the difference in refractive index at the interface between different components.

The light-outcoupling layer 2 preferably extends outward from the central region S at least to the surrounded region RP, and more preferably extends outward from the central region S over the surrounded region RP to the periphery. When the light-outcoupling layer 2 is formed, the light generated in the electroluminescent laminate 10 transmits via the light-outcoupling layer 2 out of the transparent substrate 1. If the light-outcoupling layer 2 is light diffusive, the light is diffused, generating light traveling toward the peripheral region 2X outside the central region S in the light-outcoupling layer 2. When the light-outcoupling layer 2 is formed in the region of the adhesive sealing portion 7 or further in the external region 2Y of the adhesive sealing portion 7, light traveling toward the peripheral regions 2X and 2Y outside the central region S is generated in greater amount by light diffusion. Thus, it is possible to obtain light coming out of the region (peripheral regions 2X and 2Y outside the central region 5) where no electroluminescent laminate 10 is formed. It is thus possible to reduce or eliminate the area of non-light-emitting region in the peripheral region and thus to obtain an organic EL element higher in in-plane light-emitting area rate.

The electroluminescent laminate 10 is a laminate of the first electrode 3, the organic layer 4 and the second electrode 5. The electroluminescent laminate 10 is formed on the first surface 201 of the light-outcoupling layer 2. Thus, the light-outcoupling layer 2 can serve as a substrate for formation of the first electrode 3, the organic layer 4 and the second electrode 5. In the present embodiment, a composite substrate of a transparent substrate 1 and a light-outcoupling layer 2 can be used as the substrate.

The first electrode 3 and the second electrode 5 are paired electrodes. Normally, the first electrode 3 is anode and the second electrode 5 is cathode, or vice versa. The first electrode 3 is transparent and becomes the light outcoupling-sided electrode. The second electrode 5 may be light reflective. In such a case, the light emitted toward the second electrode 5 from the electroluminescent layer may be reflected by the second electrode 5 and emitted through the transparent substrate 1. Alternatively, the second electrode 5 may be a light-transmitting electrode. When the second electrode 5 is transparent, it is possible to make the EL element have a structure in which the light is emitted from the rear face (covering substrate 6-sided face). When the second electrode 5 is transparent, a light-reflecting layer may be formed on the rear face of the second electrode 5, i.e., the first surface 501 (surface opposite to the organic layer 4). In this case, the light traveling toward the second electrode 5 may be reflected by the light-reflecting layer and emitted through the transparent substrate 1. The light-reflecting layer then may be of scatter reflection or of mirror reflection. The second electrode 5 can be made, for example, of Al or Ag.

The organic layer 4, which is a layer having a function to emit light, has multiple layers appropriately selected from hole-injecting layer, hole-transporting layer, light-emitting layer, electron-transporting layer, electron-injecting layer, intermediate layer. The thickness of the organic layer 4 is not particularly limited, but it is, for example, about 60 to 300 nm.

The covering substrate 6 can be formed by using a low-water permeability material. For example, a glass or metal material may be used. The covering substrate 6 may have or may not have a recess for housing the electroluminescent laminate 10. When the covering substrate 6 has no recess, it is possible to cover the electroluminescent laminate with the covering substrate 6 so that a flat face of the covering substrate 6 faces the transparent substrate 1. Besides, the covering substrate 6 can be formed of a sheet-shaped material as it is.

The covering substrate 6 is adhered to the transparent substrate 1 via an adhesive sealing portion 7. The adhesive sealing portion 7 is formed on the first surface 101 side of the transparent substrate 1, surrounding the periphery region OS outside the electroluminescent laminate 10. However in the example of FIG. 1, the adhesive sealing portion 7 is not in direct contact with the transparent substrate 1 but in contact with the connection electrode 11 formed on the first surface 101 of the transparent substrate 1 and the light-outcoupling layer 2 in the opening region A which divides the connection electrode 11 into a first connection electrode 11a and a second connection electrode 11b. The opening region A is formed, by removing part of the connection electrode 11 so that part of the light-outcoupling layer 2 is exposed at both ends in the third direction D3 perpendicular to the second direction. In the embodiment of FIGS. 1A and 1B, the opening region A is formed in the U shape. When the covering substrate 6 and the transparent substrate 1 are adhered to each other via the adhesive sealing portion 7 surrounding the periphery of the electroluminescent laminate 10, the electroluminescent laminate 10 is isolated and sealed from the external space.

The adhesive sealing portion 7 is made of a suitable adhesive material and, for example, a resinous adhesive material may be used. The resinous adhesive material preferably has moisture proofness. For example, when the resinous adhesive contains a drying agent, it is possible to improve the moisture proofness. The resinous adhesive material may be a material containing a thermosetting resin or an ultraviolet hardening resin as the major component.

The region between the transparent substrate 1 and the covering substrate 6 where the electroluminescent laminate 10 is covered (internal sealing space 8) may be filled with a filler or left as a hollow sealing space. When the internal sealing space 8 in the surrounded region between the transparent substrate 1 and the covering substrate 6 is filled with a filler, it is possible to reduce contact of the covering substrate 6 with the electroluminescent laminate 10 even when the covering substrate 6 is bent inward during sealing with the covering substrate 6, and to produce the element more reliably. The filler may be a hardening resin composition containing a drying or desiccating agent. It is also possible to fill the internal sealing space 8 with a filler easily by using a fluidal resin composition. The filler may be hardened or not. When the filler contains a drying or desiccating agent, it is possible to absorb water with the filler and prevent penetration of water to the organic layer 4, even if water penetrates inward.

Alternatively when the internal sealing space 8 is not filled with a filler and left vacant as a hollow sealing space, the sealing space preferably contains a drying agent. It is thus possible to absorb the water penetrated therein, even when water penetrates into the sealing space. For example, the drying agent may be placed in the sealing space, as it is adhered to the electroluminescent laminate 10-sided face of the covering substrate 6. However, installation of the hollow sealing space and bonding the drying agent often result in increase in thickness and thus, it is preferable to fill the internal sealing space 8 with a filler for reduction of thickness, as described above.

In the organic EL element, light is generated by binding between holes and electrons in the organic layer 4 when voltage is applied to the first electrode 3 and the second electrode 5. Therefore, it is needed to install electrode terminals respectively electrically connected to the first electrode 3 and the second electrode 5 in the region outside the surrounded region. The electrode terminals are terminals for electrical connection to external electrodes. In the embodiment shown in FIGS. 1A and 1B, the electrode terminals are the connection electrode 11 formed on the first surface 201 of the light-outcoupling layer 2.

The first connection electrode 11a electrically connected to the first electrode 3 and the second connection electrode 11b electrically connected to the second electrode 5 are formed on the surface 101a of an edge of the transparent substrate 1. In the embodiment of FIGS. 1A and 1B, the surface 101a of the edge of the transparent substrate 1 is the same as the first surface 101 of the transparent substrate 1. In the present embodiment, the electroconductive layer constituting the first electrode 3 is extended outward from the region where the adhesive sealing portion 7 is formed to the peripheral region TE of the transparent substrate 1, thus forming the first connection electrode 11. The peripheral region TE of the transparent substrate 1 is the end region surrounding the transparent substrate 1 at the periphery of it. That is, the electroconductive layer constituting the first electrode 3 extends outward from the surrounded region RP, and therefore the end Ea is formed where the first connection electrode 11a is formed on the first surface 201 side of the light-outcoupling layer 2. When the first connection electrode 11a electrically connected to the first electrode 3 extends outward from the region covered with the covering substrate 6 (surrounded region RP), the end Ea can serve as an electrode terminal in the region outside the surrounded region RP. As in the present embodiment, it is possible to form the first connection electrode 11a easily by extending the first electrode 3.

Also in the present embodiment, the second connection electrode 11b is formed by dividing the electroconductive layer for the first electrode 3 into a part and the first electrode 3. The part extends toward the peripheral region TE of the transparent substrate 1 out of the region where the adhesive sealing portion 7 is to be formed (adhesion region RB). Thus, the electroconductive layer constituting the second connection electrode 11b is formed by separating the part from the first electrode 3, and the part extends outward from inside the surrounded region RP onto the first surface 201 of the light-outcoupling layer 2. The end Eb of the second connection electrode 11b electrically connected to the second electrode 5 is extended outward from the region covered with the covering substrate 6 (surrounded region RP). It is possible in this way to form the end Eb as an electrode terminal in the region outside the surrounded region RP. The second connection electrode 11b is in contact and overlapped with the second electrode 5 inside the surrounded region RP and thus the second connection electrode 11b and the second electrode 5 are electrically connected.

The first electrode 3, the first connection electrode 11a and the second connection electrode 11b can be made of the same conductive material. It is thus possible to produce the organic EL element easily. The electroconductive layer of the first electrode 3 can be made of, for example, a transparent metal oxide. Specifically, for example, the electroconductive layer can be made of ITO.

The connection electrode 11 (first connection electrode 11a and second connection electrode 11b) may be made of a conductive material different from that for the electroconductive layer for the first electrode 3. In such a case, the connection electrode 11 may be made less resistant than the electroconductive layer for the first electrode 3. For example, because the connection electrode 11s are preferably less resistant, they may be a metal layer such as of aluminum, copper or molybdenum. The connection electrode 11s may be made of the material for the second electrode 5. When the connection electrode 11 is made of a material other than that for the first electrode 3, since being formed in the substrate end region, the connection electrode 11 may not be transparent because they are formed in the substrate end region. Both of the first connection electrode 11a and the second connection electrode 11b may be made of a conductive material other than that for the electroconductive layer for the first electrode 3. Alternatively, one of the first connection electrode 11a and the second connection electrode 11b may be made of a conductive material other than that for the electroconductive layer for preparation of the first electrode 3.

In the organic EL element of the present embodiment, the light-outcoupling layer 2 has an average thickness T1 in the adhesion region RB, where the adhesive sealing portion 7 is formed, smaller than the thickness T0 in the central region S where the electroluminescent laminate 10 is formed. Thus, the relationship of T1<T0 is satisfied. The central region S of the light-outcoupling layer 2 is normally formed at a certain thickness T0. When a plastic material is adhered to the first surface 201 of the light-outcoupling layer 2, the thickness T0 of the light-outcoupling layer 2 in the central region S is approximately identical with the thickness of the plastic material. The adhesion region RB is, as shown in FIG. 1A, the region having a shape corresponding to the adhesive sealing portion 7 surrounding the periphery of the electroluminescent laminate 10. The average thickness T1 in the adhesion region RB may be constant or not over the entirety of the adhesion region RB. The average thickness T1 of the adhesion region RB is preferably identical with that of the entirety of the adhesion region RB for easier production of the element. When the average thickness T1 of the adhesion region RB varies at different positions, the average thickness T1 in the adhesion region RB preferably satisfies the relationship of T1<T0.

The average thickness T1 of the adhesion region RB can be calculated from the thickness T3 of the light-outcoupling layer 2 along the inside of the adhesive sealing portion 7, and the rate of the sectional area of the light-outcoupling layer 2 in the adhesion region RB with respect to the area calculated by multiplying the thickness T3 of the light-outcoupling layer 2 by the width (for example, width in the third direction D3) of the adhesive sealing portion 7 in the cross section of the transparent substrate 1 in the thickness direction (first direction D1). It is preferable that the light-outcoupling layer 2 has a thin region. The average thickness T1 of the light-outcoupling layer 2 in the adhesion region RB is preferably not larger than the thickness T0 in the central region S over the entire adhesion region RB.

The electroluminescent laminate 10 is interposed between the transparent substrate 1 and the covering substrate 6 which face to each other, and the peripheral region OS of the electroluminescent laminate 10 is also surrounded, and thus, the electroluminescent laminate 10 is enclosed and isolated from outside. As described in the embodiment of FIG. 11, when the electroluminescent laminate 10 formed on the first surface 201 of the light-outcoupling layer 2 is sealed, water may penetrate into the element via the light-outcoupling layer 2. Thus in the organic EL element of the present embodiment, the average thickness T1 of the light-outcoupling layer 2 in the adhesion region RB is made smaller than that in the central region S. Thus, the light-outcoupling layer 2 is thinner in the peripheral region of the light-outcoupling layer 2. Therefore, the thinned region of the light-outcoupling layer 2 is an only path for water to enter the inside. Since water is less likely to enter the thinned region of the light-outcoupling layer 2 and therefore to enter the inside, it is possible to suppress that water reaches the organic layer 4 via the light-outcoupling layer 2 easily. Thus, the thinned region of the light-outcoupling layer 2 at a peripheral region serves as bottleneck (barrier), and it is possible to reduce significantly penetration of water from outside and degradation of the element.

Further in the organic EL element of the present embodiment, the thickness T2 of the light-outcoupling layer 2 in the end region RT (peripheral region TE) outside the adhesion region RB is preferably thinner than the thickness T0 in the central region S where the electroluminescent laminate 10 is formed. Thus, the relationship of T2<T0 is satisfied. In the relationship above, if the thickness T2 in the end region RT varies at different positions, the thickness T2 in the end region RT may refer to the thickness at the thickest position in the end region RT. The light-outcoupling layer 2 preferably has an inclined portion 9 where the first surface 201 of the light-outcoupling layer 2 is inclined, as the thickness of the layer gradually declines in the direction outward from the central region S.

In the embodiment shown in FIGS. 1A and 1B, the light-outcoupling layer 2 becomes gradually thinner at the position closer to the peripheral region TE, and the thickness T2 of the light-outcoupling layer 2 in the end region RT is smaller than the thickness T0 in the central region S. An inclined portion 9 where the thickness gradually declines in the direction from outside the central region S to the peripheral region TE of the transparent substrate 1 is formed in the light-outcoupling layer 2 across the adhesive sealing portion 7. The inclined portion 9 extends outward from inside the surrounded region RP not only in the region between the central region S and the adhesion region RB but also in the adhesion region RB and the end region RT.

In the organic EL element of the present embodiment, the end region RT of the light-outcoupling layer 2 has a thickness T2 smaller than the thickness T0 in the central region S and the organic EL element is thus resistant to penetration of water. Since water penetrates inward through the light-outcoupling layer 2, an increase in thickness T2 of the light-outcoupling layer 2 in the end region RT may widen the passage for water invasion and penetration, and may lead to further facile penetration of water. However, when the end region RT of the light-outcoupling layer 2 has a thickness T2 smaller than the thickness T0 in the central region S, water does not enter from outside the organic EL element into the light-outcoupling layer 2 easily and, even if water enters, water penetrates less easily inward because the thickness T2 is smaller. As the light-outcoupling layer 2 is thinner over the entire periphery, penetration of water from outside is inhibited effectively and degradation of the element effectively prevented.

Further in the embodiment shown in FIGS. 1A and 1B, the light-outcoupling layer 2 is gradually thinner in the outward direction and the thickness T2 of the light-outcoupling layer 2 in the end region RT is smaller than the average thickness T1 in the adhesion region RB. Thus, the relationship of T2<T1 is satisfied and the relationship of T2<T1<T0 is also satisfied for the thickness of the light-outcoupling layer 2. When the thickness of the end region RT is smaller than that of the adhesion region RB, as described above, the passage for water penetration is narrower and thus, water penetration is prevented more effectively.

Also in the present embodiment, since the inclined portion 9 where the first surface 201 of the light-outcoupling layer 2 is inclined is formed, the light-outcoupling layer 2 becomes thinner gradually. If the light-outcoupling layer 2 becomes thinner stepwise without formation of the inclined portion 9, the electroconductive layer constituting the first electrode 3, for example, may be broken in the region, as the light-outcoupling layer 2 becomes thinner stepwise. However when an inclined portion 9 is formed, the layer to be formed on the first surface 201 of the light-outcoupling layer 2 is to be on the inclined surface 9. Therefore, the layer can be successfully formed not to have a breakage, and thus, it is possible to obtain an element higher in conduction reliability.

In the embodiment shown in FIGS. 1A and 1B, the inclined portion 9 has a steeply inclined portion 9a where the surface is inclined at a greater angle (e.g., 45° or more) from the first surface 101 of the transparent substrate 1 and a gently inclined portion 9b where the surface is inclined at a smaller angle (e.g., less than 45°) from the first surface 101 of the transparent substrate 1. In the embodiment, the inclined portion 9 is formed so that the inclination angle from the first surface 101 of the transparent substrate 1 becomes smaller gradually in the outward direction. Thus, there is not a step formed at the boundary between the steeply inclined portion 9a and the gently inclined portion 9b and the angle changes gradually. The steeply inclined portion 9a is formed in the surrounded region RP (inside the adhesive sealing portion 7) while the gently inclined portion 9b is formed in the adhesion region RB. It is thus possible to avoid installation of the adhesive sealing portion 7 in the steeply inclined portion and thus raise adhesiveness of the adhesive sealing portion 7. The light-outcoupling layer 2 becomes steeply inclined and thinner inside the surrounded region RP and it is thus possible to reduce the thickness of the light-outcoupling layer 2 in the adhesion region RB further and prevent water penetration.

In the embodiment shown in FIGS. 1A and 1B, the inclined portion 9 has a concave-surfaced curved inclined plane and the inclined portion 9 can be formed by curved surface processing of the end surface of the light-outcoupling layer 2.

In the present embodiment, the gently inclined portion 9b is extended to the edge of the light-outcoupling layer 2, but may not be. For example, the edge of the gently inclined portion 9b may be located inside the end of the light-outcoupling layer 2 and outside the adhesion region RB or inside the adhesion region RB. The gently inclined portion 9b may not be formed. In such a case, the surface in the region outside the inclined portion 9 in the light-outcoupling layer 2 may be a flat face in parallel with the transparent substrate 1.

As described above in the present embodiment, the thickness T2 of the light-outcoupling layer 2 in the end region RT is preferably smaller than the thickness T0 in the central region S. The thickness T2 may be or may not be constant over the peripheral region. In the embodiment shown in FIGS. 1A and 1B, the light-outcoupling layer 2 becomes thinner in the position closer to the peripheral region TE, and it is possible, in such a case, to prepare the element easily by making the thickness thinner at the same rate in the direction toward periphery. When the first surface 201 of the light-outcoupling layer 2 in the end region RT is formed in parallel with the first surface 101 of the transparent substrate 1, it is possible to prepare the element easily by making the thickness of the light-outcoupling layer 2 in the end region RT constant over the peripheral region. The first surface 201 of the light-outcoupling layer 2 in the adhesion region RB may be formed in parallel with the first surface 101 of the transparent substrate 1. It is thus possible to raise the adhesiveness of the adhesive sealing portion 7.

In the present embodiment, a total thickness of the light-outcoupling layer 2, the connection electrode 11 and the adhesive sealing portion 7 at the position in the adhesion region RB where the electrodes 11 is formed is preferably not smaller than a total thickness of the light-outcoupling layer 2 and the electroluminescent laminate 10 in the central region S. In other words, the total thickness of the light-outcoupling layer 2, the connection electrode 11 and the adhesive sealing portion 7 in the adhesion region RB is preferably not smaller than the total thickness of the light-outcoupling layer 2, the first electrode 3, the organic layer 4 and the second electrode 5 in the central region S. It is thus possible to cover the electroluminescent laminate 10 easily by using a flat covering substrate 6 having a flat sealing face. Since the adhesive sealing portion 7 has a thickness different between at the position having connection electrode 11 and at the position not having the connection electrode 11, the thickness of the adhesive sealing portion 7 is determined based on the position where the connection electrode 11 is formed. Normally, the thickness of the connection electrode 11 (first connection electrode 11a and second connection electrode 11b) is identical with that of the first electrode 3. Thus as described above, the relationship of the thickness may be determined as the thickness of connection electrode 11 and the first electrode 3 is subtracted.

The adhesive sealing portion 7 may have a function as a spacer for preservation of the thickness of the electroluminescent laminate 10 during covering with the covering substrate 6. The covering substrate 6 may have a recess for housing of the electroluminescent laminate 10, which is formed for example by engraving a glass material, but it may become complicated to produce such a covering substrate 6 if such a recess is formed, leading to increase in cost. However, when the adhesive sealing portion 7 has such a thickness above, the adhesive sealing portion 7 becomes bulkier and the surface of the adhesive sealing portion 7 (first face of the adhesive sealing portion 7 in the first direction D1) is placed on the covering substrate 6 side (first side of the electroluminescent laminate 10 in the first direction D1) at a position higher than the surface of the electroluminescent laminate 10. It is thus possible to perform sealing by adhesion of the flat face side of the covering substrate 6.

In the present embodiment, the connection electrode 11 is formed on the first surface 201 of the light-outcoupling layer 2 and is hardly formed or not formed at all on the first surface 101 of the transparent substrate 1. If the adhesive sealing portion 7 is formed on the first surface 101 (surface 101a) of the transparent substrate 1 in the peripheral region TE without formation of a light-outcoupling layer 2 in the peripheral region of the transparent substrate 1, the connection electrode 11 extending outward from inside the surrounded region RP on the first surface 101 of the transparent substrate 1 are formed. In such a case, it is needed, in order to form the connection electrode 11, to form an electroconductive layer over the boundary between the transparent substrate 1 and the end region of the light-outcoupling layer 2. However, in the present embodiment, as the light-outcoupling layer 2 is present and is thinner on the peripheral regions 2X and 2Y, it is possible to form the connection electrode 11 with the electroconductive layer formed on the first surface 201 of the light-outcoupling layer 2. It is thus possible to form the connection electrode 11 more easily and to prepare an element resistant to water penetration easily.

In the present embodiment, the light-outcoupling layer 2 may become thinner at the position closer to the peripheral region TE of the transparent substrate 1, and the edge thereof may not be exposed outward. Further on the peripheral region TE of the transparent substrate 1, a region where the connection electrode 11 (electroconductive layer constituting the first electrode 3) is in contact with the transparent substrate 1 without intervention by the light-outcoupling layer 2 may be formed along the peripheral edge of the light-outcoupling layer 2. In this case, the peripheral region of the light-outcoupling layer 2 is covered with the connection electrode 11 (electroconductive layer) extending to the first surface 101 of the transparent substrate 1, prohibiting outward exposure of the light-outcoupling layer 2 and it is thus possible to prevent water penetration further.

The boundary between the electroconductive layer constituting the first electrode 3 and the first surface 201 of the light-outcoupling layer 2 may be coated with a moisture-proof film. In such a case, as the light-outcoupling layer 2 is not exposed outward, it is possible to highly prevent water penetration. The moisture-proof film may be prepared with a material higher in moisture proofness than the light-outcoupling layer 2. It may be, for example, an inorganic material. When the moisture-proof film is formed, the moisture-proof film is preferably formed at least on the first surface 201 of the light-outcoupling layer 2 in the surrounded region RP. Further, the moisture-proof film is more preferably formed over the boundary region between the electroconductive layer constituting the first electrode 3 and the first surface 201 of the light-outcoupling layer 2, including the region outside the surrounded region RP.

Figure 2:
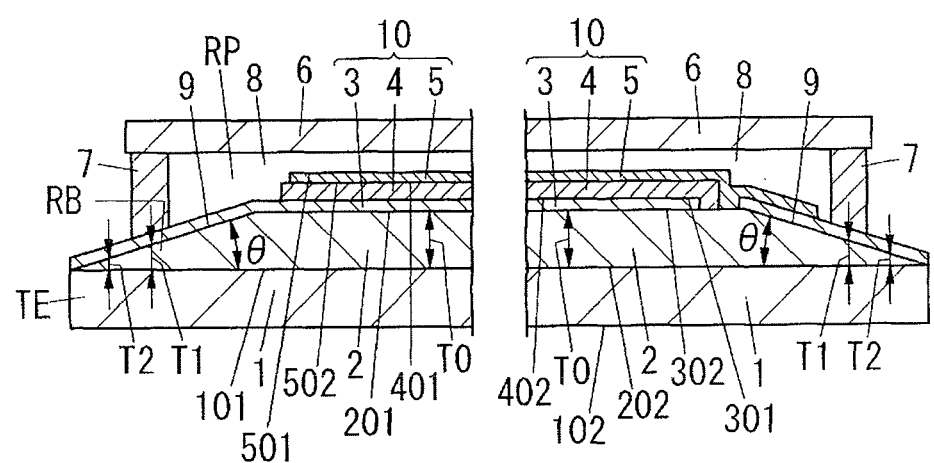
FIG. 2 is a cross-sectional view illustrating an embodiment of the organic electroluminescent element.

FIG. 2 shows another embodiment of the organic EL element. The organic EL element in the present embodiment has the plan view identical to that of FIG. 1A. The organic EL element has a configuration similar to that shown in FIGS. 1A and 1B except that the configuration of the peripheral region is different.

Specifically, it has an electroluminescent laminate 10 having a transparent first electrode 3, an organic layer 4 and a second electrode 5 which are arranged in that order on the light-outcoupling layer 2-sided first surface 201 of a transparent substrate 1 carrying a light-outcoupling layer 2 on the first surface 101. A covering substrate 6 facing the transparent substrate 1 is adhered to the transparent substrate 1 via an adhesive sealing portion 7 surrounding the periphery of the electroluminescent laminate 10. In addition, a connection electrode 11 extending outward from the surrounded region RP where the electroluminescent laminate 10 is covered with the covering substrate 6 is formed on the first surface 201 of the light-outcoupling layer 2.

Also in the present embodiment, the light-outcoupling layer 2 becomes thinner gradually at the position closer to the peripheral region TE of the transparent substrate 1, and the thickness T1 in the adhesion region RB and the thickness T2 in the end region RT are smaller than the thickness T0 in the central region S. The relationship T2<T1<T0 in terms of thickness is also satisfied. It is thus possible to prevent water penetration inward through the light-outcoupling layer 2.

In the present embodiment, the light-outcoupling layer 2 has an inclined portion 9 where the surface is inclined as the thickness of the layer becomes thinner in the direction outward from the central region S. The thickness of the light-outcoupling layer 2 decreases at a certain inclination angle in the inclined portion 9. The present embodiment is different in this point from the embodiment of FIGS. 1A and 1B. Also in the present embodiment, since the first surface 201 of the light-outcoupling layer 2 is inclined, the electroconductive layer (first electrode 3 and connection electrode 11) formed on the first surface 201 of the light-outcoupling layer 2 are less vulnerable to breakage.

As shown in FIG. 2, the inclination angle of the first surface 201 of the light-outcoupling layer 2 is designated by inclination angle θ. The inclination angle θ is the acute angle formed by the first surface 101 of the transparent substrate 1 and the first surface 201 of the light-outcoupling layer 2. The inclination angle θ may be any angle not larger than 90°, such as of 80° or less, 70° or less, 60° or less, 45° or less, or, 30° or less. However, an excessively smaller inclination angle θ may lead to expansion of the inclined portion 9 and thus increase in the area. Accordingly, the inclination angle θ may be set to any angle, such as 15° or more, 30° or more, 45° or more, or 60° or more. In the embodiment shown in FIGS. 1A and 1B, the light-outcoupling layer 2 has a configuration in which the inclination angle θ becomes gradually smaller at the position closer to the peripheral region TE.

In the embodiment of FIG. 2, the inclined portion 9 has a linear flat inclination plane and it is possible to form the inclined portion 9 by flattening the end surface of the light-outcoupling layer 2 at an angle. This configuration is advantageous in that it may be possible to form the inclined portion more easily than in the embodiment of FIGS. 1A and 1B. However, for further reduction in thickness of the light-outcoupling layer 2 in the substrate peripheral region, the configuration shown in the embodiment of FIGS. 1A and 1B in which the inclination angle decreases gradually or stepwise is more advantageous.

The embodiments shown in FIGS. 1A and 1B and FIG. 2 are examples in which the light-outcoupling layer 2 becomes thinner gradually at the position closer to the peripheral region TE of the transparent substrate 1. However, the present invention is not limited thereto.

FIGS. 3A to 3D show other embodiments of the organic EL element. FIGS. 3A to 3D show the first connection electrode 11*a*-sided end Ea. Although not shown in the figures, the light-outcoupling layer 2 can have a similar structure also in the second connection electrode 11*b*-sided end Eb.

Figure 3A:
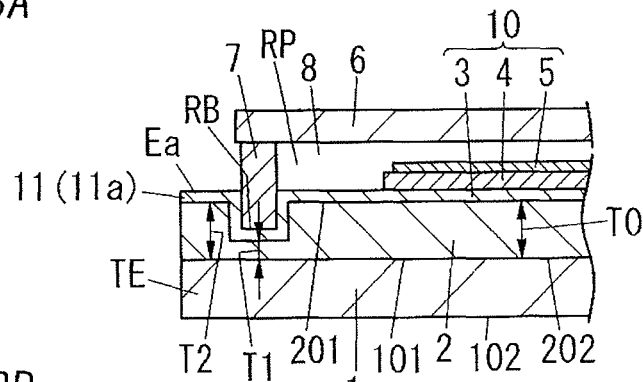
FIGS. 3A to 3D are cross-sectional views each partly illustrating an embodiment of the organic electroluminescent element.

In the embodiment of FIG. 3A, the light-outcoupling layer 2 is thinner only in the adhesion region RB where the adhesive sealing portion 7 is formed, and the thickness T1 of the adhesion region RB is smaller than the thickness T0 in the central region S. Thus, the configuration satisfies the relationship of T0<T1. Thus, the light-outcoupling layer 2 in the adhesion region RB has the smaller thickness, and therefore functions as a bottle neck (barrier). Hence, it is possible to prevent inward penetration of water. However, the thickness T2 in the end region RT of the light-outcoupling layer 2 is the same as the thickness T0 in the central region S, and the relationship in thickness can be expressed by T2=T0. The configurations in FIGS. 1A and 1B and FIG. 2 are more advantageous for further prevention of water penetration. Also for prevention of breakage of the electroconductive layer, the configurations of FIGS. 1A and 1B and FIG. 2, which have the inclined portion 9, are more advantageous. The configuration in the embodiment of FIG. 3A is advantageous in that it is possible to produce the organic EL element easily because the thickness of the light-outcoupling layer 2 can be reduced by indenting or removing the adhesion region RB of the light-outcoupling layer 2.

Figure 3B:
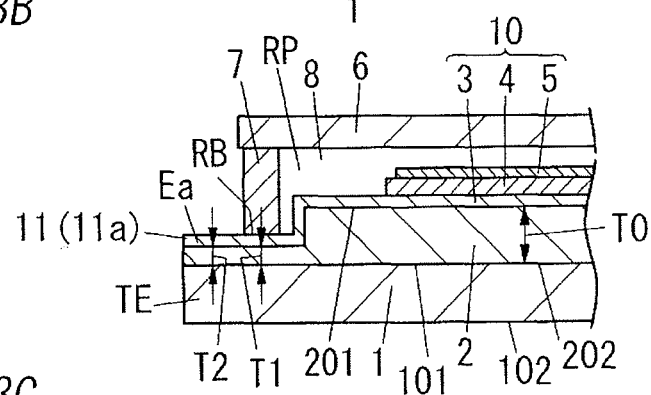

In the embodiment of FIG. 3B, the light-outcoupling layer 2 becomes thinner stepwise outward in the area inside the adhesive sealing portion 7. The first surface 201 of the light-outcoupling layer 2 has two planes in parallel with the first surface 101 of the transparent substrate 1 and a plane between them which is perpendicular to the first surface 101 of the transparent substrate 1. In the light-outcoupling layer 2, the thickness T0 in the central region S, the thickness T1 of the adhesion region RB and the thickness T2 of the end region RT have a relationship of T2=T1<T0. Thus, since the light-outcoupling layer 2 becomes thinner in the end region RT, it is possible to prevent inward water penetration more effectively than the light-outcoupling layer 2 in the embodiment of FIG. 3A. However, the first surface 201 of the light-outcoupling layer 2 has a step due to the change in thickness of the light-outcoupling layer 2, and has a surface perpendicular to the first surface 101 of the transparent substrate 1, and there is no inclined portion 9 formed. Thus, the electroconductive layer may be broken in such a configuration and thus, the configurations shown in FIGS. 1A and 1B and FIG. 2 are more advantageous for prevention of breakage of the electroconductive layer. The configuration in the embodiment of FIG. 3B is more advantageous in productivity because it is possible to reduce the thickness of the light-outcoupling layer 2 by indenting or removing parts thereof along the perpendicular direction to the first surface 101 of the transparent substrate 1 in the region outside the central region S of the light-outcoupling layer 2.

Figure 3C:
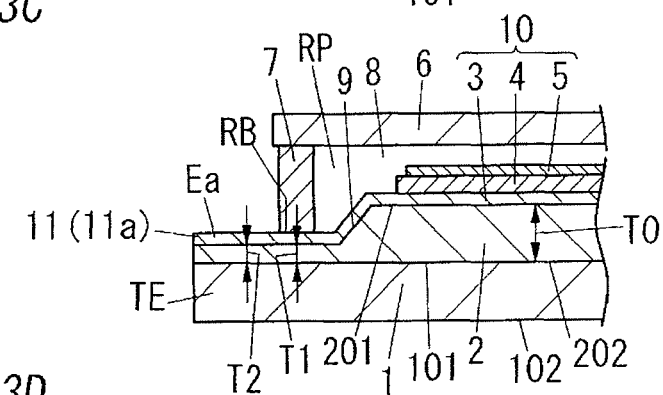

In the embodiment of FIG. 3C, the light-outcoupling layer 2 has an inclined portion 9 formed inside the adhesive sealing portion 7, and the thickness of the light-outcoupling layer 2 is smaller in the adhesion region RB and the end region RT. The first surface 201 of the light-outcoupling layer 2 has two planes in parallel with the first surface 101 of the transparent substrate 1 and an inclination plane between them which is inclined to the first surface 101 of the transparent substrate 1. The thickness T0 in the central region S, the average thickness T1 in the adhesion region RB and the thickness T2 in the end region RT of the light-outcoupling layer 2 has a relationship of T2=T1<T0. Thus, since light-outcoupling layer 2 becomes thinner in the direction outward from inside the surrounded region RP to the peripheral region TE, it is possible to prevent inward water penetration more effectively than in the configuration shown in the embodiment of FIG. 3A. Further in the present embodiment, as the inclined portion 9 is formed in the region where the thickness of the light-outcoupling layer 2 changes, it is possible to prevent breakage of the electroconductive layer more effectively than in the configuration shown in the embodiment of FIG. 3B and increase conduction reliability. However, since the thickness T2 in the end region RT of the light-outcoupling layer 2 is constant, the configurations shown in FIGS. 1A and 1B and FIG. 2 in which the end region RT is thinner are more advantageous for further inward prevention of water penetration. Advantageously in the embodiment of FIG. 3C, it may be possible to produce the organic EL element easily because the light-outcoupling layer 2 can be thinned by indenting or removing parts thereof in the region outside the central region S of the light-outcoupling layer 2, forming a flat plane.

Figure 3D:
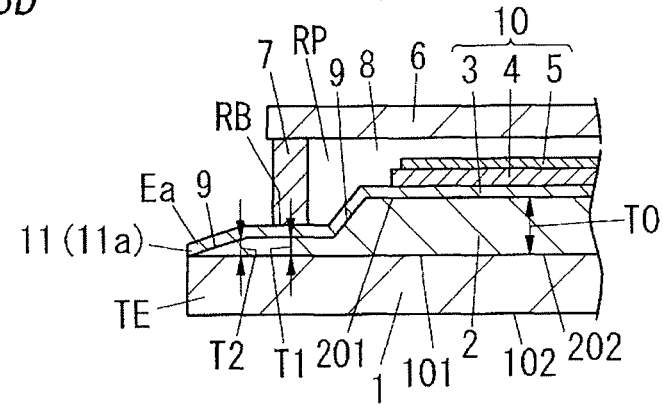

In the embodiment of FIG. 3D, the light-outcoupling layer 2 has an inclined portion 9 formed inside the adhesive sealing portion 7 and the thickness is smaller in the adhesion region RB. Also in the end region RT, another inclined portion 9 is formed in the peripheral region TE and the thickness of the light-outcoupling layer 2 becomes smaller in the position closer to the end region. The first surface 201 of the light-outcoupling layer 2 has two planes in parallel with the first surface 101 of the transparent substrate 1 and an inclination plane located between them and also another inclination plane in the peripheral region TE which are inclined to the first surface 101 of the transparent substrate 1. In the light-outcoupling layer 2, the thickness T0 in the central region S, the average thickness T1 of the adhesion region RB and the thickness T2 of the end region RT have a relationship of T2<=T1<T0. As the light-outcoupling layer 2 becomes thinner in the direction from inside the surrounded region RP to the peripheral region TE, it is possible to prevent inward water penetration more effectively than in the configuration in the embodiment of FIG. 3A. Further in the present embodiment, as there is an inclined portion 9 formed in the region where the thickness of the light-outcoupling layer 2 changes, it is possible to prevent breakage of the electroconductive layer more effectively than in the configuration shown in the embodiments of FIG. 3B and FIG. 3C and to increase conduction reliability. Further in the present embodiment, since the light-outcoupling layer 2 becomes thinner in the position closer to the peripheral region TE in the end region RT, it is more resistant to water penetration into the light-outcoupling layer 2 and it is possible to prevent inward water penetration more effectively than in the configuration in the embodiment of FIG. 3C. Advantageously in the embodiment of FIG. 3D, it may be possible to produce the organic EL element easily because the light-outcoupling layer 2 can be thinned only by indenting or removing part thereof in the region outside the central region S of the light-outcoupling layer 2, forming a flat plane.

In the embodiment of FIG. 3D, a region where the connection electrode 11 and the transparent substrate 1 are in contact with each other via the light-outcoupling layer 2 may be formed along the peripheral edge of the light-outcoupling layer 2 in the peripheral region TE of the transparent substrate 1. In this case, since the peripheral edge of the light-outcoupling layer 2 is covered with the connection electrode 11 (electroconductive layer) extending to the first surface 101 of the transparent substrate 1, the light-outcoupling layer 2 is less exposed outward, and it is thus possible to prevent inward water penetration further.

In each embodiment of FIGS. 3A to 3D, since the region of the light-outcoupling layer 2 where the adhesive sealing portion 7 is formed can be made flat-surfaced, it is possible to improve adhesiveness of the adhesive sealing portion 7. It may also be possible to form the adhesive sealing portion 7 easily.

Figure 4A:
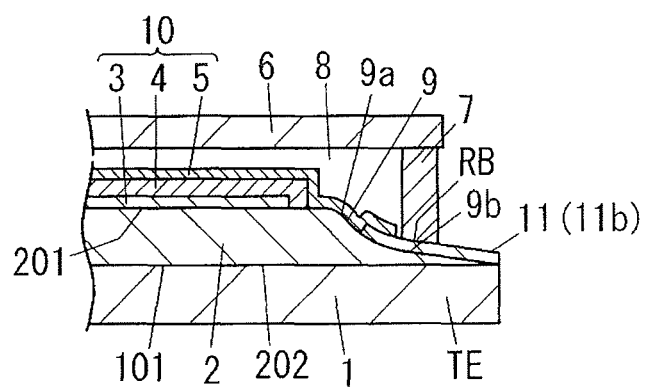
FIGS. 4A and 4B are cross-sectional views each partly illustrating an embodiment of the organic electroluminescent element.
Figure 4B:
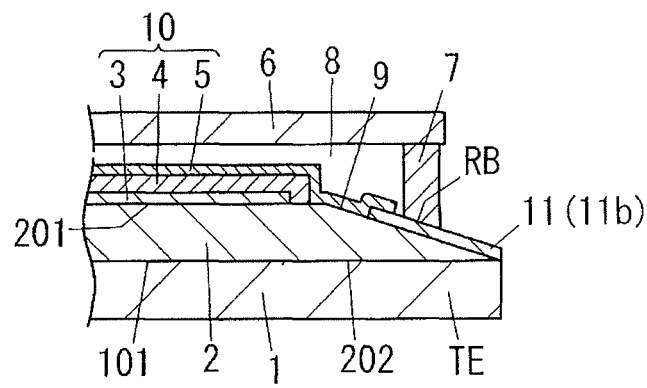

FIGS. 4A and 4B each show an embodiment of the organic EL element, in which the second connection electrode 11b-sided end Eb of the EL element is shown. In the embodiment of FIG. 4A, similarly to the embodiment of FIGS. 1A and 1B, the light-outcoupling layer 2 becomes thinner as the inclination angle becomes smaller gradually. Also in the embodiment of FIG. 4B, similarly to the embodiment of FIG. 2, the light-outcoupling layer 2 becomes thinner at a certain inclination angle. The embodiments of FIGS. 4A and 4B and the embodiments of FIGS. 1A and 1B and FIG. 2 are different in the position where the second connection electrode 11b is in contact with the second electrode 5.

In the embodiments of FIGS. 1A and 1B and FIG. 2, the second connection electrode 11b extends inside the surrounded region RP to the first surface 201 of the light-outcoupling layer 2 that has the thickness identical with the thickness T0 in the central region S and the second connection electrode 11b and the second electrode 5 are in contact with each other on the flat first surface 201 of the light-outcoupling layer 2. Alternatively in the embodiments of FIGS. 4A and 4B, the second connection electrode 11b and the second electrode 5 are in contact with each other, as separated by a particular distance in the inclined portion 9 of the light-outcoupling layer 2 where the light-outcoupling layer 2 has a thickness smaller than that of the central region S. For prevention of breakage between the layer of the second connection electrode 11b and the layer of the second electrode 5, the second connection electrode 11b and the second electrode 5 are preferably brought into contact with each other on a flat face of the light-outcoupling layer 2, similarly to FIGS. 1A and 1B and FIG. 2, compared to the case where these layers are formed on an inclined plane. However, if there is no problem of breakage, the first connection electrode 11b may be brought into contact with the second electrode 5 in the inclined portion 9, as in the embodiments shown in FIGS. 4A and 4B.

Although an example in which the second connection electrode 11b is prepared with the electroconductive layer constituting the first electrode 3 is shown in each embodiment above, the second connection electrode 11b may be prepared with the electroconductive material different from that for electroconductive layer for preparation of the first electrode 3. For example, the second connection electrode 11b may be prepared by extending the second electrode 5.

Figure 5A:
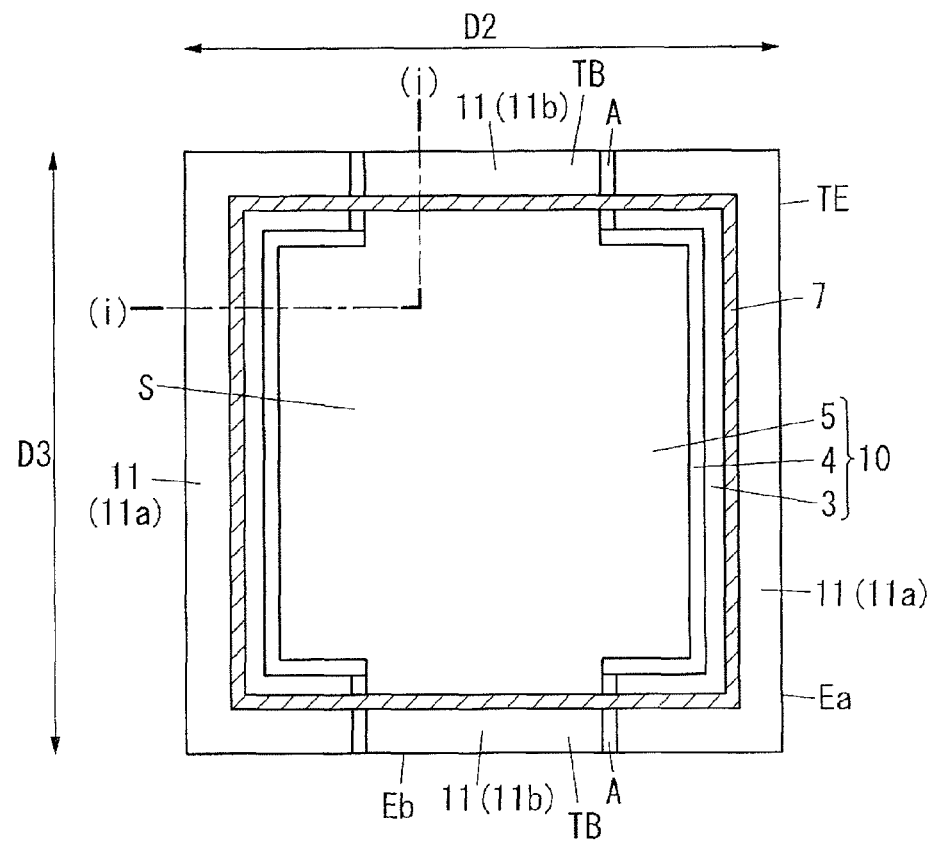
FIG. 5A is a plan view illustrating an embodiment of the organic electroluminescent element and FIG. 5B is a cross-sectional view thereof along the line (i)-(i) in FIG. 5A.
Figure 5B:
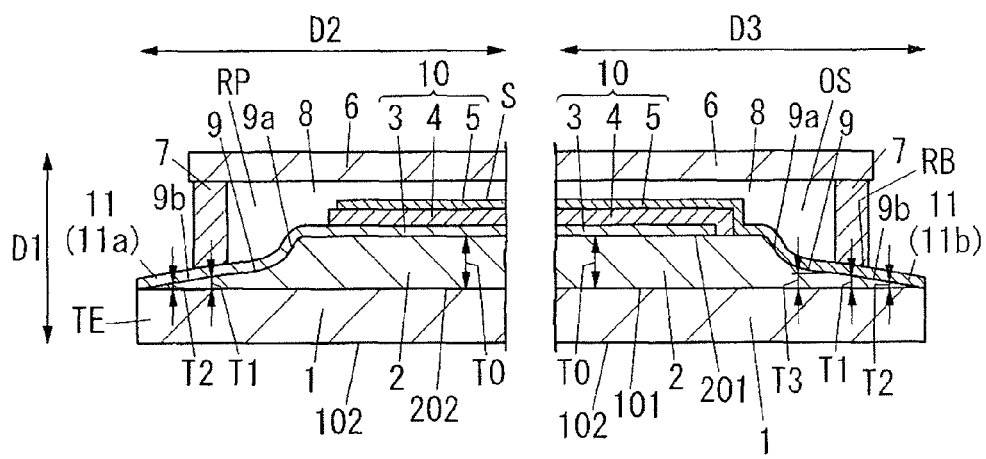

FIGS. 5A and 5B show an embodiment of the organic EL element. The embodiment of FIGS. 5A and 5B has a configuration similar to that in the embodiment of FIGS. 1A and 1B, except that the second connection electrode 11b-sided end Eb is different.

Specifically, an electroluminescent laminate 10 having a transparent first electrode 3, an organic layer 4 and a second electrode 5 arranged in this order is formed over the first surface 101 of a transparent substrate 1 which carries a light-outcoupling layer 2. In addition, a covering substrate 6 facing the transparent substrate 1 is adhered to the transparent substrate 1 via an adhesive sealing portion 7 formed surrounding the periphery of the electroluminescent laminate 10. Further, a connection electrode 11 extending outward from inside the surrounded region RP where the electroluminescent laminate 10 is covered with the covering substrate 6 is formed at least on the first surface 201 of the light-outcoupling layer 2.

In such a case, in the opening region A described above, the entire opening region A is preferably formed in such a manner that the light-outcoupling layer 2 is exposed. It is thus possible to separate the first connection electrode 11a and the second connection electrode 11b with the opening region A.

Also in the present embodiment, the light-outcoupling layer 2 becomes thinner gradually as the position closer to the peripheral region TE and the average thickness T1 in the adhesion region RB and the thickness T2 in the end region RT are smaller than the thickness T0 in the central region S. The thickness satisfies the relationship of T2<T1<T0. It is thus possible to prevent inward water penetration through the light-outcoupling layer 2.

In the present embodiment, the second connection electrode 11b is formed, as the second electrode 5 is extended to the peripheral region TE of the transparent substrate 1 outside the region where the adhesive sealing portion 7 is formed. Thus, the second electrode 5 on the first surface 201 of the light-outcoupling layer 2 extends outward from inside the surrounded region RP. Since the second electrode 5 extends outward from the region (surrounded region RP) covered with the covering substrate 6, it is possible to form an electrode terminal outside the surrounded region RP. In the present embodiment, since the second connection electrode 11b is made of the material for the second electrode 5, it is possible to form the second connection electrode 11b without need for the electrode patterning such as patterning for forming the second connection electrode 11b separately from the electroconductive layer for first electrode 3. It may be thus possible to simplify the electrode patterning and prepare the EL element more easily than in the configuration shown in the embodiment of FIGS. 1A and 1B. However, if the electrode patterning is easy, the embodiment of FIGS. 1A and 1B, in which the light-outcoupling layer 2 is covered with the electroconductive layer easily, is more advantageous.

Figure 6:
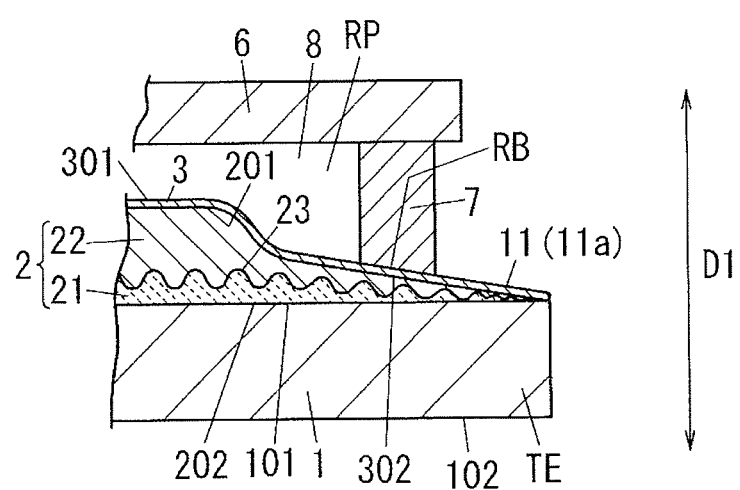
FIG. 6 is a cross-sectional view partly illustrating an embodiment of the organic electroluminescent element.

FIG. 6 shows an embodiment of organic EL element. Although the organic layer 4 and the second electrode 5 are not shown in FIG. 6, the organic layer 4 and the second electrode 5 may of course be present in the element. Although the first connection electrode 11a-sided end Ea is shown in FIG. 6, the organic EL element shown in the embodiment of FIG. 6 is an element including an electroluminescent laminate 10 having a transparent first electrode 3, an organic layer 4 and a second electrode 5 in that order formed on the light-outcoupling layer 2-sided first surface 201 of a transparent substrate 1. A covering substrate 6 facing the transparent substrate 1 is adhered to the first surface 101 of the transparent substrate 1 via an adhesive sealing portion surrounding the periphery of the electroluminescent laminate 10. A connection electrode 11 extending outward from inside the surrounded region RP where the electroluminescent laminate 10 is covered with the covering substrate 6 is formed at least on the first surface 201 of the light-outcoupling layer 2. In the light-outcoupling layer 2, the average thickness T1 in the adhesion region RB where the adhesive sealing portion is formed is smaller than the thickness T0 in the central region S where the electroluminescent laminate 10 is formed.

In the embodiment shown in FIG. 6, the light-outcoupling layer 2 has a low-refractive index layer 21 placed on the transparent substrate 1 side and a high-refractive index layer 22 higher in refractive index than the low-refractive index layer 21 that is placed on the first electrode 3 side. When the low-refractive index layer 21 is placed on the transparent substrate 1 side and the high-refractive index layer 22 on the first electrode 3 side, it is possible to prevent total reflection and emit the light outward more effectively because the difference in refractive index is mediated.

For an example, it is preferable that one of a low-refractive index layer 21 and a high-refractive index layer 22, which is less moisture-permeable, extends outward over the other layer.

For example, the difference in refractive index between the low-refractive index layer 21 and the high-refractive index layer 22 is only relative. Thus, the low-refractive index layer 21 may have a refractive index higher than that of the transparent substrate 1. The refractive index can be controlled by a suitable method, for example, by adding particles for adjustment of refractive index, adding a low-refractive index resin or introducing pores.

In the present embodiment, an uneven structure 23 is formed at the interface between the low-refractive index layer 21 and the high-refractive index layer 22. When the light-outcoupling layer 2 has a multi-layer structure and the interface has an uneven structure 23, as described above, it is possible to increase the light outcoupling efficiency further. The uneven structure 23 is preferably formed at least in the region where the electroluminescent laminate 10 is formed but, for higher light outcoupling efficiency, it is preferably formed in the region including the adhesion region RB where the adhesive sealing portion 7 is formed. The uneven structure 23 is more preferably formed outside the surrounded region RP in the light-outcoupling layer 2, for example, over the entire region of the light-outcoupling layer 2 in a plan view.

When the light-outcoupling layer 2 is formed, the light generated in the electroluminescent laminate 10 is emitted through the light-outcoupling layer 2 out of the transparent substrate 1. The light diffuses in the light-outcoupling layer 2, generating light proceeding toward the peripheral side. If the light-outcoupling layer 2 is formed at the position in the adhesive sealing portion 7 and its external region, the amount of the light proceeding to the peripheral region by light diffusion increases, allowing light emission form the region where the electroluminescent laminate 10 is not formed. It is thus possible to make the non-light-emitting region in the peripheral region smaller or eliminate it completely and thus to obtain an organic EL element higher in in-plane light-emitting area rate. The diffusion of the light in the light-outcoupling layer 2 occurs effectively when the uneven structure 23 is formed. Accordingly, the uneven structure 23 is preferably extended outward further at least to the adhesion region RB.

Figure 7A:
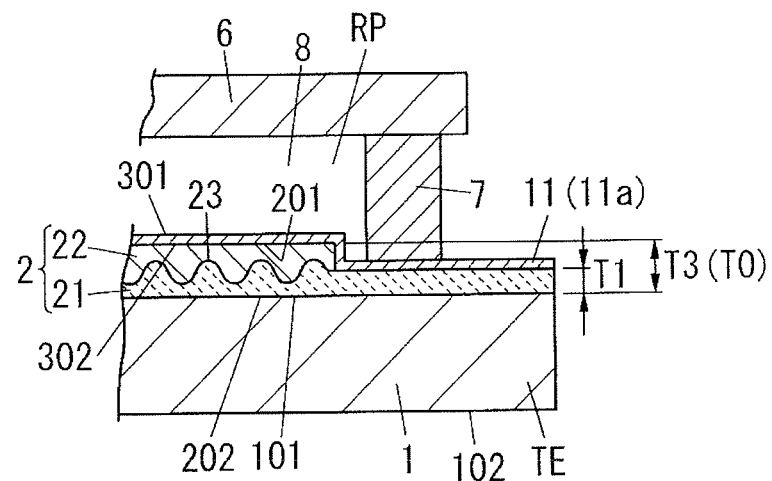
FIGS. 7A and 7B are cross-sectional views each partly illustrating an embodiment of the organic electroluminescent element.
Figure 7B:
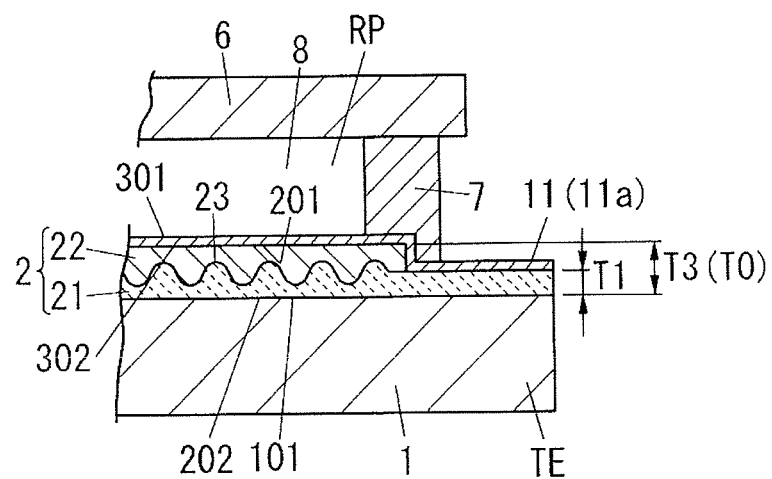

FIGS. 7A and 7B show an embodiment of the organic EL element. Although the organic layer 4 and the second electrode 5 are not shown in FIGS. 7A and 7B, the organic layer 4 and the second electrode 5 may of course be present in the element. FIGS. 7A and 7B show the first connection electrode 11a-sided end Ea. The first connection electrode 11a is preferably formed as the second connection electrode 11b as in the configuration reversed from that in FIGS. 7A and 7B.

In the embodiment of FIGS. 7A and 7B, the light-outcoupling layer 2 has a low-refractive index layer 21 placed on the first surface 101 of the transparent substrate 1 and a high-refractive index layer 22 higher in refractive index than the low-refractive index layer 21 that is placed on the second surface 302 of the first electrode 3. In other words, the light-outcoupling layer 2 has a low-refractive index layer 21 and a high-refractive index layer 22. The low-refractive index layer 21 is formed on the first surface 101 of the transparent substrate 1 and the high-refractive index layer 22 is formed on the low-refractive index layer 21. Such a configuration can mediate the difference in refractive index and reduce thus total reflection, permitting higher light outcoupling efficiency. An uneven structure 23 is formed at the interface between the low-refractive index layer 21 and the high-refractive index layer 22. It is thus possible to increase diffusion of light and the light outcoupling efficiency further.

The low-refractive index layer 21 and the high-refractive index layer 22 are formed at a total thickness of T3. In the light-outcoupling layer 2 of the present embodiment, the high-refractive index layer 22 is formed in a region smaller in a plan view than the low-refractive index layer 21, and the peripheral edge of the high-refractive index layer 22 is placed inside the peripheral edge of the adhesive sealing portion 7. Thus, the average thickness T1 of the light-outcoupling layer 2 in the adhesion region RB is smaller than the thickness T0 in the central region S. The total thickness T3 of the low-refractive index layer 21 and the high-refractive index layer 22 may be the same as the thickness T0 of the light-outcoupling layer 2 in the central region S. In the case of such a multilayer configuration, the light-outcoupling layer 2 in the adhesion region RB can be made thinner easily by forming a single-layer region or a region having a smaller number of layers than the number of layers in the central region. Of course, the thickness T3 may be altered as in the embodiment in FIG. 6, but in the embodiment of FIGS. 7A and 7B, the thickness of the light-outcoupling layer 2 can be reduced easily in the peripheral region TE of the transparent substrate 1 without change in thickness of the each constituent layer.

The uneven structure 23 is formed in the region where the low-refractive index layer 21 and the high-refractive index layer 22 are overlapping each other in a plan view. It is possible to improve the light outcoupling efficiency effectively by forming an uneven structure 23 in the region where the low-refractive index layer 21 and the high-refractive index layer 22 are overlapping each other. When the low-refractive index layer 21 in the region where it is not overlapped by the high-refractive index layer 22 does not have surface unevenness on the surface, the surface of the low-refractive index layer 21 in the region may be flat. Thus, when an electroconductive layer is desirably formed on the surface of the low-refractive index layer 21, it is possible to make the electroconductive layer laminated reliably.

For improvement of the light outcoupling efficiency, the uneven structure 23 is preferably extended further outward. In the embodiment of FIG. 7A, the peripheral edge of the high-refractive index layer 22 is located inside the internal edge of the adhesive sealing portion 7 and the high-refractive index layer 22 is formed in the surrounded region RP without contact with the adhesive sealing portion 7. Thus, the uneven structure 23 is not extended to the adhesion region RB. On the other hand, the peripheral edge of the high-refractive index layer 22 in the embodiment of FIG. 7B are placed outward from the internal edge of the adhesive sealing portion 7, and the high-refractive index layer 22 is extended to the adhesion region RB so as to be in contact with the adhesive sealing portion 7. The uneven structure 23 formed at the interface between the low-refractive index layer 21 and the high-refractive index layer 22 is extended to the adhesion region. Thus, the configuration of FIG. 7B is superior in light outcoupling efficiency to that of FIG. 7A. However in the embodiment of FIG. 7A, it is possible to form the adhesive sealing portion 7 in the region where the thickness of the light-outcoupling layer 2 does not vary and such a configuration is advantageous in that it is possible to form the adhesive sealing portion 7 reliably as it is favorably fixed.

In the present embodiment, the low-refractive index layer 21 preferably has a moisture-permeability lower than the high-refractive index layer 22. It is thus possible to prevent water penetration through the low-refractive index layer 21 of the light-outcoupling layer 2 which is located outside the surrounded region RP.

Figure 8A:
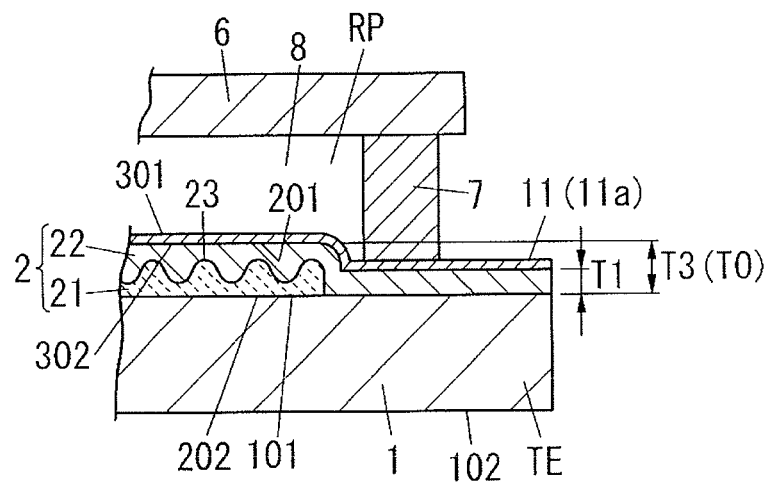
FIGS. 8A and 8B are cross-sectional views each partly illustrating an embodiment of the organic electroluminescent element.
Figure 8B:
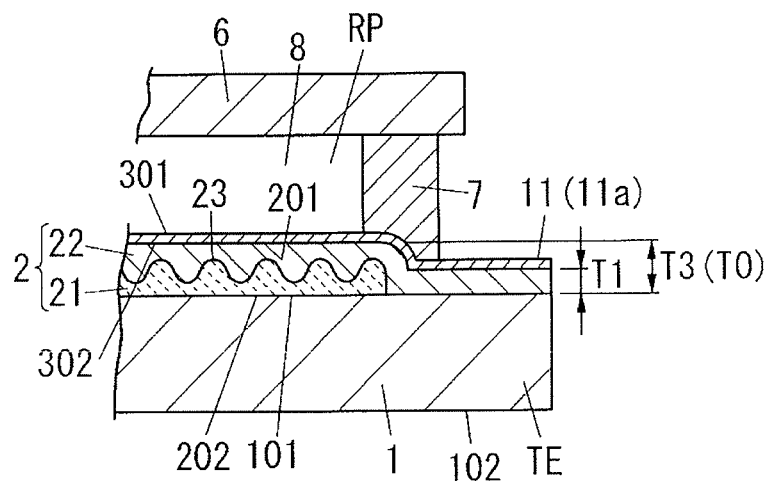

FIGS. 8A and 8B show an embodiment of the organic EL element. FIGS. 8A and 8B show the cross section of a region where the electroconductive layer constituting the first electrode 3 is absent (region between the first connection electrode 11a and the second connection electrode 11b) and thus, the electroconductive layer constituting the first electrode 3 is not shown in the figure. However, the first electrode 3 and connection electrode 11 may of course be present.

In the embodiment of FIGS. 8A and 8B, the light-outcoupling layer 2 has a low-refractive index layer 21 placed on the transparent substrate 1 side and a high-refractive index layer 22 which is higher in refractive index than the low-refractive index layer 21 and is placed on the first electrode 3 side. Such a configuration mediates the difference in refractive index and thus total reflection, permitting higher light outcoupling efficiency. In addition, an uneven structure 23 is formed at the interface between the low-refractive index layer 21 and the high-refractive index layer 22. It is thus possible to increase diffusion of light and increase the light outcoupling efficiency further.

The low-refractive index layer 21 and the high-refractive index layer 22 are formed at a total thickness of T3. In the light-outcoupling layer 2 of the present embodiment, the low-refractive index layer 21 is formed in a region smaller than that of the high-refractive index layer 22 in a plan view, and the peripheral edge of the low-refractive index layer 21 is placed inside the peripheral edge of the adhesive sealing portion 7. Thus the thickness T1 of the light-outcoupling layer 2 in the adhesion region RB is smaller than the thickness T0 in the central region S. The total thickness T3 of the low-refractive index layer 21 and the high-refractive index layer 22 may be the same as the thickness T0 of the light-outcoupling layer 2 in the central region S. In the case of such a multilayer configuration, the light-outcoupling layer 2 in the adhesion region RB can be made thinner easily by forming a single-layer region or a region having a smaller number of layers than the number of layers in the central region. Of course, the thickness T3 may vary as in the embodiment of FIG. 6. In the embodiment of FIGS. 7A and 7B, the thickness of the light-outcoupling layer 2 can be reduced easily in the peripheral region TE of the transparent substrate 1 without change in thickness of the each constituent layer.

The uneven structure 23 is formed in the region where the low-refractive index layer 21 and the high-refractive index layer 22 are overlapping each other in a plan view. It is thus possible to improve the light outcoupling efficiency effectively by forming an uneven structure 23 in the region where the low-refractive index layer 21 and the high-refractive index layer 22 are overlapping each other. When the high-refractive index layer 22 in the region where it is not overlapped by the low-refractive index layer 21 does not have surface unevenness on the transparent substrate 1-sided surface, the transparent substrate 1-sided surface of the high-refractive index layer 22 in the region may be flat. Thus, it is possible to make the high-refractive index layer 22 tightly adhered to the transparent substrate 1 and to prevent water penetration further.

For improvement of the light outcoupling efficiency, the uneven structure 23 is preferably extended further to the external side. In the embodiment of FIG. 8A, the peripheral edge of the low-refractive index layer 21 is located inside the internal edge of the adhesive sealing portion 7 and the low-refractive index layer 21 is formed inside the surrounded region RP. Thus, the uneven structure 23 does not extend to the adhesion region RB. Alternatively in the embodiment of FIG. 8B, the peripheral edge of the low-refractive index layer 21 is located outside the internal edge of the adhesive sealing portion 7 and the low-refractive index layer 21 is formed also in the adhesion region RB. The uneven structure 23 formed at the interface between the low-refractive index layer 21 and the high-refractive index layer 22 is extended to the adhesion region RB. Thus, the configuration of FIG. 8B is superior in light outcoupling efficiency to that in FIG. 8A. However, the configuration in the embodiment of FIG. 8A has an advantage that the adhesive sealing portion 7 can be formed in the region where the thickness of the light-outcoupling layer 2 does not change and thus the adhesive sealing portion 7 can be prepared reliably, as it is favorably fixed.

As shown in FIGS. 7A and 7B and FIGS. 8A and 8B, the connection electrode 11 (first connection electrode 11a in the figure) extending outward from inside the surrounded region RP is formed on the first surface 201 of the light-outcoupling layer 2.

These configurations can also be used as the configuration surrounding the adhesion region RB in the present embodiment for preparation of the organic EL element similarly to the present embodiment. In this case, the electroluminescent laminate 10 is formed on the first surface 201-sided region of the light-outcoupling layer 2 in the central region S.

Specifically, although not shown in the figure, the connection electrode 11 includes a first connection electrode 11a electrically connected to the first electrode 3 and a second connection electrode 11b electrically connected to the second electrode 5. As described above, the first connection electrode 11a and the second connection electrode 11b are mutually electrically insulated by the opening region A. Therefore, voltage can be applied to the first electrode 3 and the second electrode 5 without any short-circuiting trouble.

The connection electrode 11 is extended along the first surface 201 of the light-outcoupling layer 2 outward from inside the central region S of the connection electrode 11. In addition, the adhesive sealing portion 7 is adhered to the connection electrode 11 at the position where the at least the low-refractive index layer 21, among the low-refractive index layer 21 and the high-refractive index layer 22, is formed.

In the present embodiment, the high-refractive index layer 22 is preferably higher in moisture-permeability than the low-refractive index layer 21. It is thus possible to prevent water penetration through the high-refractive index layer 22 which is a layer formed on the region of the light-outcoupling layer 2 outside the surrounded region RP.

As shown in the embodiments of FIGS. 7A and 7B and FIGS. 8A and 8B, when the light-outcoupling layer 2 has a low-refractive index layer 21 and a high-refractive index layer 22, one of the low-refractive index layer 21 and the high-refractive index layer 22, whichever is lower in moisture-permeability, is preferably extended outward over the other layer. It is thus possible to prevent water penetration. In the embodiment of FIGS. 7A and 7B, it is possible to prevent water penetration further, if the low-refractive index layer 21 lower in moisture-permeability than the high-refractive index layer 22 extends outward from the high-refractive index layer 22. In the embodiment of FIGS. 8A and 8B, it is possible to prevent water penetration further, if the high-refractive index layer 22 lower in moisture-permeability than the low-refractive index layer 21 extends outward from the low-refractive index layer 21 and the high-refractive index layer 22. One of the low-refractive index layer 21 and the high-refractive index layer 22, whichever is lower in moisture-permeability, is preferably extended to outside the adhesion region RB. It is thus possible to increase the light outcoupling efficiency and prevent water penetration further. In particular, it is possible to prevent water penetration effectively, if one of the low-refractive index layer 21 and the high-refractive index layer 22, which is higher in moisture-permeability, is formed within the surrounded region RP so as not to be exposed outward.

In the embodiments shown in FIGS. 6, 7A and 7B and 8A and 8B, the light-outcoupling layer 2 having the low-refractive index layer 21 and the high-refractive index layer 22 may be prepared with a plastic film or by coating with a resin material, as described in the embodiment of FIGS. 1A and 1B. For example, it is possible to form a light-outcoupling layer 2 by bonding a laminated plastic sheet consisting of a low-refractive index layer 21 and a high-refractive index layer 22 to a transparent substrate 1. In the embodiment of FIG. 6, it is possible to form a light-outcoupling layer 2 by bonding a multi-layer plastic sheet and deforming it. In the embodiments of FIGS. 7A and 7B and FIGS. 8A and 8B, it is possible to use a plastic sheet having a low-refractive index layer 21 and a high-refractive index layer 22, one of which is smaller in the size suitably for enclosure inside the adhesion region RB. Alternatively, the light-outcoupling layer 2 may be formed by forming a low-refractive index layer 21 and a high-refractive index layer 22 sequentially on the first surface 101 of the transparent substrate 1. It is possible easily in this case to adjust the size of the layer and place one of the low-refractive index layer 21 and the high-refractive index layer 22 inside the peripheral edge of the adhesion region RB. The low-refractive index layer 21 and the high-refractive index layer 22 may be formed by application of a resin material or by adhesion of a plastic film. When the low-refractive index layer 21 and the high-refractive index layer 22 are coated sequentially, it is possible to prepare an uneven structure 23 easily by forming a low-refractive index layer 21 and then surface-roughening the low-refractive index layer 21 or by applying a low-refractive index layer 21 having an irregular surface, and then applying a high-refractive index layer 22 thereon. The uneven structure 23 formed at the interface between the low-refractive index layer 21 and the high-refractive index layer 22 may have a lens array structure, such as that described in the embodiment of FIGS. 1A and 1B.

Figure 9A:
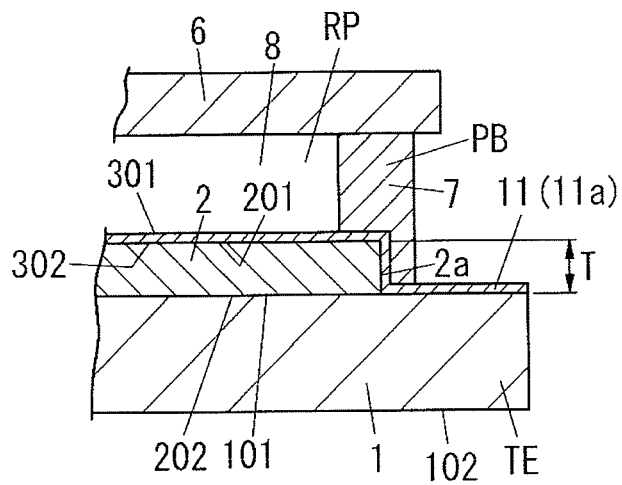
FIGS. 9A to 9C are cross-sectional views each partly illustrating an embodiment of the organic electroluminescent element.
Figure 9B:
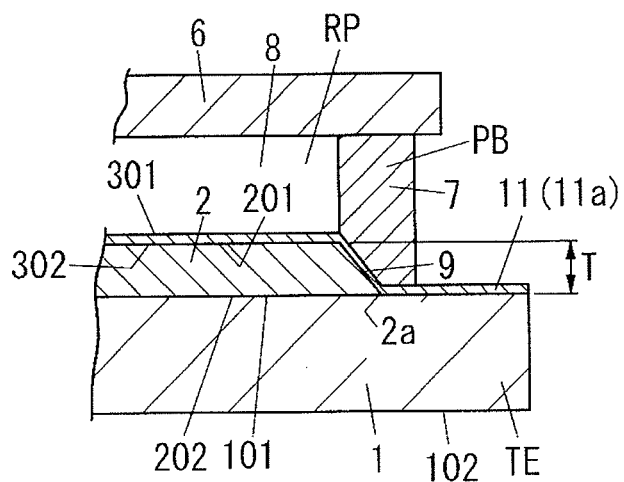
Figure 9C:
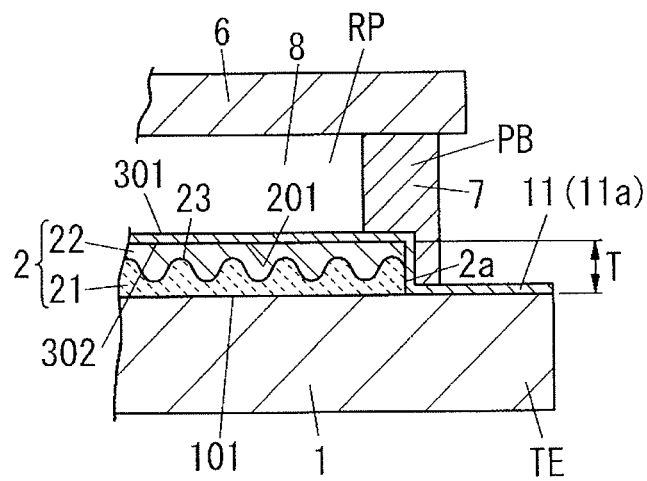

FIGS. 9A to 9C each show an embodiment of the organic EL element. FIGS. 9A to 9C show the cross sections of the region where the electroconductive layer constituting the first electrode 3 is absent (the region between the first connection electrode 11a and the second connection electrode 11b). Although the electroconductive layer constituting the first electrode 3 is not shown in the figure, the first electrode 3 and the connection electrode 11 may of course be present.

In the embodiment of FIGS. 9A to 9C, the end 2a of the light-outcoupling layer 2 is placed in the adhesion region RB where the adhesive sealing portion 7 is formed. In the present embodiment, the end 2a of the light-outcoupling layer 2 is located in the adhesion region RB and the average thickness of the layer becomes smaller in the adhesion region RB. In a favorable embodiment, the end 2a of the light-outcoupling layer 2 is located in the surrounded region RP and the peripheral edge of the light-outcoupling layer 2 is located inside the peripheral edge of the adhesive sealing portion 7 and also outside the internal edge of the adhesive sealing portion 7. Since the light-outcoupling layer 2 can be formed inside the surrounded region RP, it is possible to form the light-outcoupling layer 2, as unexposed outward, and prevent water penetration by making the adhesive sealing portion 7 serve as the barrier (barrier wall) to water. As the light-outcoupling layer 2 extends not only in the central region S but also to the surrounded region RP, it is possible to decrease the non-light-emitting region in the peripheral region by light diffusion and increase the light outcoupling efficiency. The thickness of the light-outcoupling layer 2 in the adhesion region RB may be considered to be the average thickness in the adhesion region RB.

In the embodiment of FIGS. 9A to 9C, the thickness T of the light-outcoupling layer 2 may not vary in the entire surface of the light-outcoupling layer 2. In this case, it is possible to reduce the average thickness of the adhesion region RB by placing the end 2a of the light-outcoupling layer 2 in the adhesion region RB. The average thickness of the adhesion region RB can be calculated from the thickness T of the light-outcoupling layer 2 and the rate of the sectional area of the light-outcoupling layer 2 in the adhesion region RB with respect to the area calculated by multiplying the thickness T of the light-outcoupling layer 2 by the width (for example, width in the third direction D3) of the adhesive sealing portion 7 in the cross section of the transparent substrate 1 in the thickness direction (first direction D1). It is thus possible to prepare a light-outcoupling layer 2 higher in light outcoupling efficiency and resistant to water penetration by forming the adhesive sealing portion 7 on the end 2a of the light-outcoupling layer 2 without any change in the thickness T of the light-outcoupling layer 2.

Of course, even if the thickness T of the light-outcoupling layer 2 may change as in the embodiments of FIGS. 1A to 6, the end 2a of the light-outcoupling layer 2 may be placed in the surrounded region RP. It is thus possible to prevent water penetration further. However, in order to obtain a smaller non-light-emitting region in the peripheral region, it is more preferable that the light-outcoupling layer 2 extends outward from the adhesion region RB.

In the embodiment of FIG. 9A, the end 2a of the light-outcoupling layer 2 is a plane substantially perpendicular to the first surface 101 of the transparent substrate 1. In the embodiment in which the end 2a has a plane perpendicular to the substrate, as described above, it is possible to form the light-outcoupling layer 2 easily.

In the embodiment of FIG. 9B, an inclination plane inclined to the first surface 101 of the transparent substrate 1 is formed and thus an inclined portion 9 is formed in the end region of the light-outcoupling layer 2. The inclined portion 9 may be identical with that in the embodiments described above. In the light-outcoupling layer 2 having the inclined portion 9, the end 2a, which defines the boundary region between the light-outcoupling layer 2 and the transparent substrate 1, is placed inside the surrounded region RP. The entire inclined portion 9 may be placed in the adhesion region RB or part of the inclined portion 9 may extend inward from the adhesion region RB. In the present embodiment in which the inclined portion 9 is formed, when the electroconductive layer is formed in the inclined portion 9, it is possible to prevent breakage of the layer.

In the embodiment of FIG. 9C, the light-outcoupling layer 2 has a low-refractive index layer 21 and a high-refractive index layer 22. In addition, an uneven structure 23 is formed at the interface between the low-refractive index layer 21 and the high-refractive index layer 22. The low-refractive index layer 21 and high-refractive index layer 22 may be layers similar to those described in the embodiments above. In the present embodiment, it is possible to prevent water penetration significantly and increase the light outcoupling efficiency.

In each embodiment of FIGS. 9A to 9C, a connection electrode 11 (first connection electrode 11a in the figure) extending outward from inside the surrounded region RP is formed on the first surface 201 of the light-outcoupling layer 2. Although not shown in the figure, the connection electrode 11 includes a first connection electrode 11a electrically connected to the first electrode 3 and a second connection electrode 11b electrically connected to the second electrode 5. The first connection electrode 11a and the second connection electrode 11b are mutually insulated electrically by forming the opening region A, as described above. Accordingly, voltage can be applied to the first electrode 3 and the second electrode 5 without any short circuiting trouble. The connection electrode 11 is extended along the first surface 201 of the light-outcoupling layer 2 outward from inside the central region S of the connection electrode 11. A part of the adhesive sealing portion 7 is a concave formed in the direction outward from inside the surrounded region RP by part (end 2a) of the light-outcoupling layer 2 carrying the connection electrode 11 and the other region of the adhesive sealing portion 7 is adhered to the first surface 101 of the transparent substrate 1 via the connection electrode 11. Thus, it is possible to perform electrical connection of the element by forming the connection electrode 11 so as to extend in the direction outward from the surrounded region RP.

Hereinafter, a method for producing the organic EL element will be described.

Figure 10A:
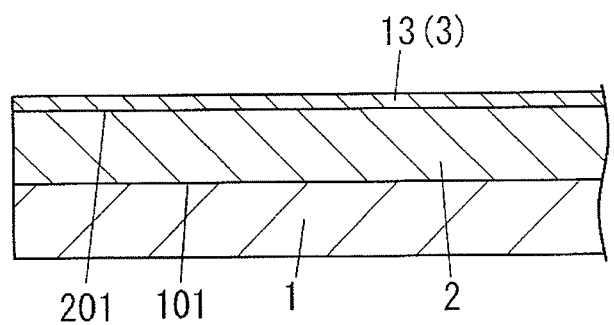
FIGS. 10A and 10B are cross-sectional views each illustrating an embodiment of the organic electroluminescent element.
Figure 10B:
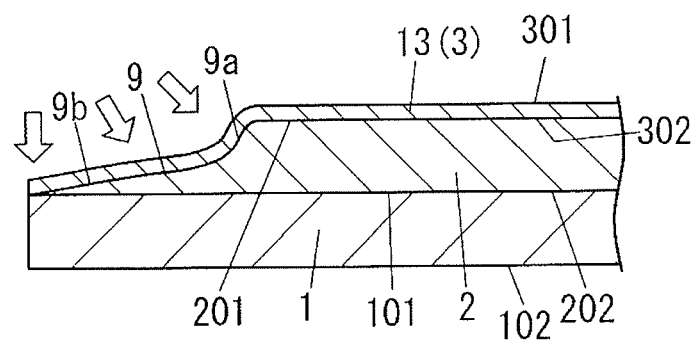

It is possible to produce the organic EL element in each embodiment above in which the thickness of the light-outcoupling layer 2 changes and is smaller in the peripheral region TE of the transparent substrate 1, by preparing a substrate material (electroconductive layer-carrying substrate) in which the light-outcoupling layer 2 is thinner in the peripheral region TE, as shown in FIGS. 10A and 10B. The substrate material can be prepared, for example, by thinning the light-outcoupling layer 2 formed on the first surface 101 of the transparent substrate 1 in the peripheral region TE.

First, a substrate having a light-outcoupling layer 2 and a transparent electroconductive layer 13 formed on the first surface 101 of a transparent substrate 1, as shown in FIG. 10A, is prepared. The substrate material can be prepared by forming a light-outcoupling layer 2 on the first surface 101 of the transparent substrate 1 and then forming a transparent electroconductive layer 13 on the first surface 201 of the light-outcoupling layer 2. Alternatively, a light-outcoupling layer 2 (plastic material) may be adhered to the surface of the transparent electroconductive layer 13. The transparent substrate 1 and the light-outcoupling layer 2 give a composite substrate. The bonding can be conducted, for example, by adhering a plastic sheet to the first surface 101 of the transparent substrate 1, which is a glass substrate, by thermal compression or with adhesive. A composite substrate for preparation of multiple elements may be prepared then. As shown in FIG. 10A, it is thus possible to obtain a substrate having a light-outcoupling layer 2 and a transparent electroconductive layer 13 formed on the first surface 101 of the transparent substrate 1. The central region of the transparent electroconductive layer 13 becomes the first electrode 3.

Then as shown in FIG. 10B, the light-outcoupling layer 2 is thinned, as the light-outcoupling layer 2 is deformed by a suitable heating mechanism from the side of the first surface 201 of the light-outcoupling layer 2. The heating mechanism used for deformation of the light-outcoupling layer 2 is, for example, press processing under heat and pressure. If the light-outcoupling layer 2 is a plastic material, it is possible to deform the layer easily because the light-outcoupling layer 2 is softened under heat. Although the light-outcoupling layer 2 becomes thinner by deformation under heat then, it is possible by adjustment of the heating temperature to deform the transparent electroconductive layer 13 formed on the first surface 201 of the light-outcoupling layer 2 so as to fit the surface of the light-outcoupling layer 2 and so as not to have a breakage. The deformed light-outcoupling layer 2 may be removed from the peripheral region TE.

It is also possible to form an inclined portion 9, as the light-outcoupling layer 2 is deformed to have an inclination plane by adjusting thermal deformation, for example, by modifying the pressurization tool into a suitable shape or by pressing the layer at a suitable inclination angle. Although the deformation may lead to destruction of the structure of the light-outcoupling layer 2 to some extent, deformation of the light-outcoupling layer 2 occurs in the exterior non-light-emitting region outside in the light-emitting region and thus, the light outcoupling efficiency remains almost unaffected. When such an inclined portion 9 is formed, the stress applied to the transparent electroconductive layer 13 is smaller than when the inclined portion 9 is deformed into a step shape. It is also possible in the presence of the inclined portion 9 to reduce the extent of deformation of the transparent electroconductive layer 13. Thus, if a light-outcoupling layer 2 carrying a transparent electroconductive layer 13 is desirably deformed, the inclined portion 9 is preferably formed.

For preparation of the organic EL element in the embodiment of FIGS. 1A and 1B, a part of the transparent electroconductive layer 13 is removed by patterning and a first electrode 3, a first connection electrode 11a and a second connection electrode 11b are formed thereon. The patterning may be conducted before deformation of the light-outcoupling layer 2. The transparent electroconductive layer 13 may become less removable after deformation of the light-outcoupling layer 2. Alternatively, a transparent electroconductive layer 13 in a pattern shape may be formed on the first surface 201 of the light-outcoupling layer 2 by lamination. Alternatively, a material for light-outcoupling layer 2 carrying a transparent electroconductive layer 13 previously formed in a pattern shape may be adhered to the transparent substrate 1.

Although the light-outcoupling layer 2 is deformed after preparation of the transparent electroconductive layer 13 in the embodiments above, a substrate material (transparent substrate 1 carrying light-outcoupling layer 2) without the transparent electroconductive layer 13 may be used, and the transparent electroconductive layer 13 may be formed after deformation of light-outcoupling layer 2 on the substrate material. In such a case, the transparent electroconductive layer 13 can be formed by lamination on the light-outcoupling layer 2 after deformation, and thus, the transparent electroconductive layer 13 can be protected from breakage. It is also possible to keep the electroconductivity of the transparent electroconductive layer 13 at a higher level. When the transparent electroconductive layer 13 is formed on the first surface 101 side of the transparent substrate 1, the transparent electroconductive layer 13 is preferably formed after the light-outcoupling layer 2 is formed on the transparent substrate 1.

A substrate material, such as that shown in FIG. 10B, can be prepared by tapering the end region of a light-outcoupling layer 2 on a transparent substrate 1 carrying the light-outcoupling layer 2 by removing process such as cutting or abrasion, and then, forming a transparent electroconductive layer 13 on the first surface 201 of the light-outcoupling layer 2. The patterning of the transparent electroconductive layer 13 can be carried out similarly to above.

It is possible in this way to obtain a substrate material, such as that shown in FIG. 10B, in which the light-outcoupling layer 2 is thinned in the peripheral region TE of the transparent substrate 1.

An organic EL element is prepared by forming an organic layer 4 and a second electrode 5 sequentially on the first surface 301 side of the first electrode 3 of the substrate material and covering the layers with a covering substrate 6.

The organic layer 4 is formed on the first surface 301 of the first electrode 3 in the central region of the transparent electroconductive layer 13. The organic layer 4 can be formed by laminating the layers constituting the organic layer 4 sequentially by vapor deposition or coating. The organic layer 4 is formed, as it extends slightly out of the first electrode 3, in the end Eb side where the second connection electrode 11b is formed. In this way, the second electrode 5 can be formed without contact with the first electrode 3. The second electrode 5 is not in contact with the first electrode 3 and is extended to the second connection electrode 11b side to be formed also on the surface of the second connection electrode 11b. The lamination of organic layer 4 and the second electrode 5 provides an electroluminescent laminate 10. If a moisture-proof film is formed between the first electrode 3 and the connection electrode 11, the moisture-proof film may be formed before lamination of the organic layer 4 or after lamination of the second electrode 5.

In sealing with the covering substrate 6, a sealant adhesive is applied onto the surface of the connection electrode 11 in the peripheral region of the transparent substrate 1 (and partially on the surface of the light-outcoupling layer 2), as the sealant adhesive surrounds the periphery of the electroluminescent laminate 10. The sealant adhesive is applied in the adhesive state. The covering substrate 6 is brought closer to the transparent substrate 1 from the electroluminescent laminate 10-sided face and the transparent substrate 1 and the covering substrate 6 are adhered to each other with the sealant adhesive, to cover the electroluminescent laminate 10. The surrounded region RP may be filled with a filler. The sealant adhesive forms an adhesive sealing portion 7.

It is possible in this way to obtain an organic EL element such as that shown in the embodiment of FIGS. 1A and 1B.

In preparation of the organic EL element in the embodiment of FIGS. 5A and 5B, a transparent electroconductive layer 13 is formed in a pattern in which the second connection electrode 11b is not formed from the transparent electroconductive layer 13, as the electrode patterning is modified. And in preparation of the second electrode 5, the material for the second electrode 5 is applied on the first surface 201 of the light-outcoupling layer 2, so as to extends outward from the surrounded region RP, to form the second connection electrode 11b. It is possible in this way to obtain the organic EL element in the embodiment of FIGS. 5A and 5B.

In preparation of the organic EL elements in the embodiments of FIGS. 7A and 7B and FIGS. 8A and 8B, it is possible to form a light-outcoupling layer 2 that is thinner in the adhesion region RB by forming a low-refractive index layer 21 and a high-refractive index layer 22 sequentially by lamination on the first surface 101 side of the transparent substrate 1. The low-refractive index layer 21 may be formed by lamination of a plastic sheet or by coating with a resin material. The high-refractive index layer 22 may be formed by lamination of a plastic sheet or by coating with a resin material. The uneven structure 23 may be formed by forming a layer having unevenness on the surface, by surface-roughening processing or by adhesion of a previously surface-roughened sheet.

For example, a low-refractive index layer 21 is first formed on the first surface 101 of the transparent substrate 1, for example, by coating with a resin material. The surface of the low-refractive index layer 21 is then stamped, for example, with a stamper with surface unevenness, allowing transfer of the surface unevenness and thus forming unevenness on the surface of the low-refractive index layer 21. Then, a high-refractive index layer 22 is formed, for example, by coating with a resin material. It is possible to prepare a composite layer, of which the low-refractive index layer 21 extends outward to the external side as shown in FIGS. 7A and 7B, by preparing a low-refractive index layer 21 over the transparent substrate 1 and a high-refractive index layer 22 on the low-refractive index layer 21 in a range smaller than the low-refractive index layer 21. Alternatively, it is possible to prepare a composite layer of which the high-refractive index layer 22 extends outward to the external side as shown in FIGS. 8A and 8B, by preparing a low-refractive index layer 21 in the area inside the peripheral edge of the adhesion region RB and a high-refractive index layer 22 covering the low-refractive index layer 21. If the low-refractive index layer 21 has a roughened surface, lamination of the low-refractive index layer 21 and the high-refractive index layer 22 gives an uneven structure 23 at interface.

The method for preparing the uneven structure 23 is not limited thereto. For example, the low-refractive index layer 21 may be formed by coating with a resin material in such a manner that the surface becomes uneven. Specifically, a particle-containing resin material, when applied, gives surface unevenness due to the particles therein. Alternatively, the uneven structure 23 may be formed by using a surface-roughened sheet and thus by utilizing the surface unevenness of the sheet. For example, it is possible to form a surface-roughened low-refractive index layer 21 by adhering a low-refractive index sheet having a roughened surface to a transparent substrate 1. Alternatively, it is possible to form unevenness by applying a high-refractive index layer 22 on the surface of a flat low-refractive index layer 21, with the surface-roughened face of the surface-roughened high refractive index sheet facing the surface of the low-refractive index layer 21. In such a case, the surface unevenness of the sheet constituting the high-refractive index layer 22 is pressed into the low-refractive index layer 21, forming an uneven structure 23 at the interface between the low-refractive index layer 21 and the high-refractive index layer 22.

After preparation of the light-outcoupling layer 2, a first electrode 3, an organic layer 4 and a second electrode 5 are formed sequentially to the first surface 201 side of the light-outcoupling layer 2, similarly to the method described above, and the layers are covered with a covering substrate 6, to give an organic EL element.

Then, in the embodiment shown in FIG. 7B, an adhesive sealing portion 7 is formed at the position over the edge of the high-refractive index layer 22 in the boundary region between the low-refractive index layer 21 and the high-refractive index layer 22. And in the embodiment shown in FIG. 8B, an adhesive sealing portion 7 is formed on the high-refractive index layer 22 at the position over the edge of the low-refractive index layer 21. Of course, the adhesive sealing portion 7 may be formed on the electroconductive layer (connection electrode 11) in the region where the electroconductive layer constituting the connection electrode 11 is formed.

It is possible in this way to obtain the organic EL elements in the embodiments shown in FIGS. 7A and 7B and FIGS. 8A and 8B.

In preparation of the organic EL element shown in FIGS. 9A to 9C, the electroconductive layer may be formed over the end 2a of the light-outcoupling layer 2 on the surfaces of the light-outcoupling layer 2 and the transparent substrate 1. An adhesive sealing portion 7 may be formed on the boundary region between the light-outcoupling layer 2 and the transparent substrate 1 at the position over the end 2a of the light-outcoupling layer 2. Of course, the adhesive sealing portion 7 may be formed on the electroconductive layer (connection electrode 11) in the region where the electroconductive layer constituting the connection electrode 11 is formed. In the embodiment of FIGS. 9A to 9C, the electroconductive layer constituting the connection electrode 11 may extend on the first surface 101 of the transparent substrate 1. It is possible in this way to form the connection electrode 11 outside the surrounded region RP and supply electricity to the organic EL element.

In the embodiment of FIGS. 9A to 9C, if the thickness T of the light-outcoupling layer 2 is constant, the light-outcoupling layer 2 can be formed easily by coating with a resin or by adhesion of a plastic sheet. If the inclined portion 9 is formed, as in FIG. 9B, the inclined portion 9 can be prepared by the preparative method for inclined portion 9 described above. When a multi-layer structure consisting of a low-refractive index layer 21 and a high-refractive index layer 22 is provided, as shown in FIG. 9C, the low-refractive index layer 21 and the high-refractive index layer 22 can be laminated by a method similar to the lamination method described above. It is thus possible to obtain the organic EL elements respectively shown in the embodiments of FIGS. 9A to 9C.

In preparation of the organic EL element, multiple pieces of the organic EL element may be prepared simultaneously, as multiple organic EL elements are formed on the first surface 101 of a continuous integrated transparent substrate 1 and then separated. Such a production process is higher in productivity because multiple organic EL elements are produced simultaneously. If multiple organic EL elements are desirably produced simultaneously, a light-outcoupling layer 2 may be formed on the entire surface of an integrated transparent substrate 1 and then, the light-outcoupling layer 2 of each organic EL element be thinned by deforming or removing the end region of the light-outcoupling layer 2 of each organic EL element. Alternatively, the end region of the light-outcoupling layer 2 may be thinned, as all or a part of the layer constituting the light-outcoupling layer 2 is laminated in a small region. The light-outcoupling layer 2 between neighboring elements may be divided then during separation of individual organic EL elements. It is thus possible to reduce cleavage defects that may occur during cleavage and separation of individual transparent substrates 1. The covering substrate 6 for use may be an integrated continuous covering substrate 6 similarly to the transparent substrate 1. After sealing, the integrated substrate carrying the covering substrate 6 can be divided into pieces at the end regions of respective organic EL elements, as the transparent substrate 1 and the covering substrate 6 are separated by cleavage.

As described above, the organic EL element according to the present invention shows improved light outcoupling efficiency, as it has a light-outcoupling layer 2 formed therein, and also resistance to inward water penetration and thus to degradation of the element because the thickness of the light-outcoupling layer 2 is thinner in the adhesion region RB than in the central region S. It is thus possible to obtain an organic EL element superior in light outcoupling efficiency and reliability. The organic EL element according to the present invention is useful as a planar lighting device.

The invention claimed is:
1. An organic electroluminescent element, comprising:
  a transparent substrate;
  an electroluminescent laminate including a first electrode, an organic layer, and a second electrode, the first electrode being transparent and disposed over a surface of the transparent substrate, the organic layer being disposed on a first surface of the first electrode, and the second electrode being disposed on a surface of the organic layer;
  a light-outcoupling layer disposed between the surface of the transparent substrate and a second surface of the first electrode;
  a covering substrate facing the transparent substrate;
  an adhesive sealing portion surrounding the electroluminescent laminate and bonding the covering substrate to the surface of the translucent substrate, the adhesive sealing portion defining a surrounded region where the electroluminescent laminate is covered with the cover substrate; and
  a connection electrode disposed on a surface of the light-outcoupling layer and extending from an inside to an outside of the surrounded region,
  wherein
  the light-outcoupling layer has an adhesion region where the adhesive sealing portion is provided and a central region where the electroluminescent laminate is disposed, the light-outcoupling layer has a thickness at the central region and an average thickness at the adhesion region which is smaller than the thickness at the central region, the light-outcoupling layer includes a low-refractive index layer and a high-refractive index layer having a refractive index larger than that of the low-refractive index layer, the low-refractive index layer is disposed closer to the surface of the transparent substrate than the high-refractive index layer, the high-refractive index layer is disposed closer to the second surface of the first electrode than the low-refractive index layer, the light-outcoupling layer has an uneven structure at an interface between the low-refractive index layer and the high-refractive index layer, and one of the low-refractive index layer and the high-refractive index layer is less moisture-permeable and extends more outward than the other layer.

2. The organic electroluminescent element according to claim 1, wherein the light-outcoupling layer has an end located at the adhesion region.

3. The organic electroluminescent element according to claim 1, wherein the light-outcoupling layer has an end region outside the adhesion region, and the light-outcoupling layer has a thickness at the end region which is smaller than the thickness at the central region where the electroluminescent laminate is disposed.

4. The organic electroluminescent element according to claim 1, wherein the light-outcoupling layer has an inclined portion where a thickness thereof is gradually smaller towards a periphery thereof than at the central region.

5. The organic electroluminescent element according to claim 1, wherein the connection electrode includes a first connection electrode electrically connected to the first electrode and a second connection electrode electrically connected to the second electrode.

6. The organic electroluminescent element according to claim 5, wherein the first connection electrode is an extended part of the first electrode.

7. The organic electroluminescent element according to claim 1, wherein a total of a thickness of the light-outcoupling layer at a position where the connection electrode is disposed in the adhesion region, a thickness of the connection electrode, and a thickness of the adhesive sealing portion is larger than a total of a thickness of the light-outcoupling layer at the central region and a thickness of the electroluminescent laminate.

8. The organic electroluminescent element according to claim 2, wherein the light-outcoupling layer has an inclined portion where a thickness thereof is gradually smaller towards a periphery thereof than at the central region.

9. The organic electroluminescent element according to claim 3, wherein the light-outcoupling layer has an inclined portion where a thickness thereof is gradually smaller towards a periphery thereof than at the central region.

* * * * *